United States Patent
Hardin et al.

(10) Patent No.: US 6,404,834 B1
(45) Date of Patent: Jun. 11, 2002

(54) SEGMENTED SPECTRUM CLOCK GENERATOR APPARATUS AND METHOD FOR USING SAME

(75) Inventors: Keith Bryan Hardin; Robert Aaron Oglesbee, both of Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 9 days.

(21) Appl. No.: 09/666,851

(22) Filed: Sep. 20, 2000

(51) Int. Cl.[7] .................................................. H03D 3/24

(52) U.S. Cl. ........................ 375/376; 375/354; 327/105; 327/156

(58) Field of Search ................................. 375/130, 327, 375/354, 371, 373, 374, 375, 376; 331/1 A, 1 R, 10, 18, 19, 23, 25; 327/105, 156, 157, 159; 713/500, 501

(56) References Cited

U.S. PATENT DOCUMENTS

| | | | |
|---|---|---|---|
| 5,079,519 A | 1/1992 | Ashby et al. | 331/1 A |
| 5,488,627 A | 1/1996 | Hardin et al. | 375/139 |
| 5,610,955 A | 3/1997 | Bland | 375/376 |
| 5,631,920 A | 5/1997 | Hardin | 375/130 |
| 5,736,893 A | 4/1998 | Packette et al. | 327/551 |
| 5,771,264 A | 6/1998 | Lane | 375/376 |
| 5,867,524 A | 2/1999 | Booth et al. | 375/130 |
| 5,872,807 A | 2/1999 | Booth et al. | 375/130 |
| 5,943,382 A | 8/1999 | Li et al. | 375/376 |
| 6,006,008 A | 12/1999 | Klaffenbach et al. | 388/813 |
| 6,046,646 A | 4/2000 | Lo et al. | 331/10 |
| 6,046,735 A | 4/2000 | Bassetti et al. | 345/205 |
| 6,167,103 A * | 12/2000 | Hardin | 375/376 |
| 6,175,259 B1 * | 1/2001 | Mann et al. | 327/159 |
| 6,294,936 B1 * | 9/2001 | Clementi | 327/156 |

OTHER PUBLICATIONS

Keith B. Hardin, John T. Fessler, Donald R. Bush; "Spread Spectrum Clock Generation for the Reduction of Radiated Emissions"; *IEEE*, 1994; pp. 227–231.

Keith B. Hardin, John T. Fessler, Donald R. Bush; "Digital Circuit Radiated Emission Suppression with Spread Spectrum Techniques"; *ITEM*, 1994; pp. 88 and 89, 278, and 280–281.

Keith B. Hardin, John T. Fessler, Donald R. Bush; "A Study of the Interference Potential of Spread Spectrum Clock Generation Techniques"; *IEEE*, 1995; pp. 624–629.

Supplemental information with graphs, re: NeoMagic video graphics IC.

(List continued on next page.)

Primary Examiner—Stephen Chin
Assistant Examiner—Betsy L. Deppe
(74) Attorney, Agent, or Firm—John A. Brady

(57) ABSTRACT

A segmented spectrum clock generator is provided that exhibits a frequency response having multiple segments that with a sharp rolloff on both sides of each individual segment's peak amplitude across the entire frequency spectrum. In order to meet proposed new CISPR-22 rules, each segment must roll off by at least 10 dB at adjacent frequencies that are ±150 kHz on both sides of (or offset from) each of the peaks. The segmented spectrum clock generator output signal is generated by a frequency synthesizer circuit that modulates the output frequency at a predetermined rate between a "lower bound" and an "upper bound" of modulation frequencies. Moreover, the modulation of the output frequencies is controlled so as to form a "segmented sperm" frequency domain output that has rather distinct peaks and valleys, and whose modulation profile has a graphical appearance of frequency vs. time that is somewhat "peaky," although many other profile shapes could instead be used.

32 Claims, 16 Drawing Sheets

OTHER PUBLICATIONS

CISPR 16–1, International Electrotechnical Commission, "Specification for radio disturbance and immunity measuring apparatus and methods," First edition; title page and pp. 21 and 180 (1993–08).

CISPR 22, International Electrotechnical Commission, "Information technology equipment—Radio disturbance characteristics—Limits and methods of measurement," Third edition; title page and p. 39 (1997–11).

Lauder, D. et al, "Investigation Into Possible Effects Resulting From Dithered Clock Oscillators on EMC Measurements and Interference to Radio Transmission Systems," Final Report prepared for the Radiocommunications Agency, University of Hertfordshire, Revision 3 (Combined); pp. 1–89 (Mar. 18, 2000); RA REF: AY3377 (510001891).

* cited by examiner

SEGMENTED SPECTRUM CLOCK GENERATOR APPARATUS AND METHOD FOR USING SAME

TECHNICAL FIELD

The present invention relates generally to computing, or microprocessor-based equipment and is particularly directed to a segmented spectrum clock generator of the type which reduces electromagnetic interference (EMI) emissions. The invention is specifically disclosed as a segmented spectrum clock generator that divides the EMI spectrum into multiple low bandwidth components having sharp roll-offs to reduce EMI emissions.

BACKGROUND OF THE INVENTION

High-speed digitally clocked systems are typically very noisy with regard to electromagnetic interference (EMI) emissions, unless some special care is taken at the design stage of equipment incorporating such clocked systems. One reliable and low-cost method for reducing EMI emissions is to use a spread spectrum clock such as is disclosed in U.S. Pat. Nos. 5,488,627 and 5,631,920. These patents disclose circuits in which the spread spectrum frequencies are varied by the use of programmable counters and by data stored in a memory circuit. These U.S. Pat. Nos. 5,488,627 and 5,631,920 are assigned to Lexmark International, Inc.

In a U.S. Pat. No. 6,167,103 (filed Oct. 8, 1998), a digital spread spectrum clock circuit is disclosed in which the clock is made variable by using Random Access Memory and a multiplexer to receive initiation data before the clock circuit is ready to run normally. This patent is titled "Variable Spread Spectrum Clock," is commonly-assigned to Lexmark International, Inc.

In a U.S. Pat. No. 6,292,507 (filed Sep. 1, 1999), a method for automatically compensating a spread spectrum clock generator circuit is disclosed that measures the pulse-width of the phase locked loop UP and DOWN signals and compares their actual pulse widths to predetermined values and corrects any deviation. This patent is titled "Method and Apparatus for Compensating a Spread Spectrum Clock Generator," and is assigned to Lexmark International, Inc.

While such prior spread spectrum clocks have often been disclosed or constructed using phase locked loop circuits, other types of frequency synthesizer circuits can be made into a spread spectrum clock, including digital locked loop circuits and delay locked loop circuits. One example of a digital locked loop circuit is disclosed in U.S. Pat. No. 5,079,519, and one example of a delay locked loop circuit is disclosed in U.S. Pat. No. 5,771,264. U.S. Pat. Nos. 6,046,646 and 5,610,955 disclose other ways to create a spread spectrum clock.

The spread spectrum clock generator designs previously available have a design sensitivity to the voltage controlled oscillator gain, charge pump current, and passive component values (in connection with phase locked loop circuits). Moreover, previous spread spectrum clock generator circuits would likely not meet certain EMI tests that have been proposed in a white paper, recently published on Mar. 18, 2000 by the Radiocommunications Agency of the United Kingdom, under RA Ref. No. AY3377(510001891), as a proposed amendment to the CISPR-22 rules.

In the CISPR-22 proposed rules, the regulations for "broadband" emissions from electronic products would be changed such that the use of a spread spectrum clock generator circuit would be required to meet much more stringent emissions requirements, and would potentially cancel most of the benefits of the use of a spread spectrum clock. The proposed rules perform an emissions test on an emitted signal, and if the signal has certain characteristics it is considered a broadband signal and would be subject to new emissions limits. If the emitted signal does not have those certain characteristics, it would then be classified as a narrowband signal and would remain subject to the existing emissions limits.

The proposed test would determine if a particular emitted frequency has an amplitude that is within 10 dB of the current limits, and if so, then it is tested to determine if it has broadband or narrowband characteristics. The proposed test measures the emissions at ±150 kHz of the frequency of interest. If these two bracketing or offset frequencies (i.e., at ±150 kHz) measure within 10 dB of the current limits, then the original signal under test is considered a broadband signal. If that is the case, then the allowed emissions limits are much lower than before.

The new measurement method being proposed in this report is as follows:

For each and every disturbance above (L−10 dB), where L is the limit level in logarithmic units, record the frequency $f_n$ at which the maximum disturbance level occurs and the disturbance level $d_n$ at that frequency. Record the antenna polarization for each reported disturbance. For each disturbance above (L−10 dB), measure the level of the disturbance $d_{nh}$ at ($f_n$+150 kHz) and $d_{nl}$ at ($f_n$−150 kHz). If $d_{nh}$ and $d_{nl}$ are both 10 dB or more below the limit level, the disturbance shall be regarded as a narrow band disturbance and the limits of tables 3 or 4 shall apply. If either $d_{nh}$ or $d_{nl}$ are less than 10 dB below the limit level, the disturbance shall be regarded as a broad band disturbance and the following procedure shall be followed.

The frequency of the measuring receiver shall be adjusted upwards from $f_n$ in increments not exceeding 100 kHz until a frequency $f_{nh}$ is reached where $(L-d_{nh})>10$ dB. The frequency of the measuring receiver shall then be adjusted downwards from $f_n$ in increments not exceeding 100 kHz until a frequency $f_{nl}$ is reached where $(L-d_{nl})>10$ dB. The total bandwidth ≅f occupied by the emission shall be calculated from ≅f=($f_{nh}-f_{nl}$). The level of each individual broad band emission at frequencies $f_n$, $f_{n+1}$, etc. shall not exceed (L−10 Log10(≅f/120 kHz)*) or (L−10 dB*) whichever is the greater, where L is the applicable limit level in logarithmic units from table 3 or 4.

Conventional single frequency clock circuits with high jitter or conventional spread spectrum clock generation circuits will likely have problems meeting the proposed new standard if it becomes implemented in Europe. A new type of clock is needed to satisfy the proposed new rules of CISPR-22, since a standard spread spectrum clock generation circuit creates a relatively flat bandwidth in the portion of the frequency spectrum where it resides. Under the new CISPR-22 proposed test this would be classified as a broadband emission. To be considered a narrowband emission, the frequency spectrum produced by the clock circuit must have frequent peaks and valleys to chop or "segment" the spectrum profile.

SUMMARY OF THE INVENTION

Accordingly, it is an advantage of the present invention to provide a segmented spectrum clock generator that creates a spectrum shape in the frequency domain that has multiple peaks and valleys within the frequency ranges of interest. It is another advantage of the present invention to provide a segmented spectrum clock generator that emits multiple peaks and valleys that occur at appropriate intervals so that the roll-off points to both sides of each peak are below 10 dB at the bracketing (offset) frequencies that are at intervals of +150 kHz and −150 kHz of the peak frequency. It is another advantage of the present invention to provide a segmented spectrum clock generator that provides a segmented spectrum form in the frequency domain having multiple peaks and valleys, and does so with a frequency synthesizer circuit at the heart of the electronics, in which the frequency synthesizer circuit could be a phase locked loop, a digital lock loop, a delay locked loop, or some other similar circuitry. It is still another advantage of the present invention to provide a segmented spectrum clock generator that produces a spectrum shape in the frequency domain that has a segmented set of multiple peaks and valleys, and is based upon a frequency synthesizer circuit that is flexible in design such that it could also be used as a spread spectrum clock generator circuit by changing certain settings that either are programmable, or can be determined at the time of manufacture. It is a further advantage of the present invention to provide a segmented spectrum clock generator that modulates its operating frequency at a predetermined modulation profile, and which determines a lower bound and an upper bound for the modulation frequency.

Additional advantages and other novel features of the invention will be set forth in part in the description that follows and in part will become apparent to those skilled in the art upon examination of the following or may be learned with the practice of the invention.

To achieve the foregoing and other advantages, and in accordance with one aspect of the present invention, a method for controlling a segmented spectrum clock generator circuit provides a clock signal to a frequency synthesizer circuit, and provides a controller; wherein the frequency synthesizer under control of the controller generates a plurality of output frequencies over time; and the plurality of output frequencies are modulated over at least one time interval according to a modulation profile such that a frequency response of the plurality of output frequencies exhibits a segmented waveform over a spectrum of amplitude versus frequency, in that the segmented waveform comprises a plurality of individual segments that each exhibit: (a) a maximum amplitude and (b) a pair of minima amplitudes, wherein a slope of the frequency response between the maximum amplitude and each of the pair of minima amplitudes exhibits a 10 dB rolloff at a predetermined frequency difference from a center frequency of the individual segment.

In accordance with another aspect of the present invention, a method for controlling a segmented spectrum clock generator circuit at a modulation frequency above a lower bound provides a clock signal to a frequency synthesizer circuit, and provides a controller, in which the frequency synthesizer under control of the controller generates a plurality of output frequencies over time; and the plurality of output frequencies are modulated over at least one time interval according to a modulation profile, such that a frequency response of the plurality of output frequencies exhibits a segmented waveform over a spectrum of amplitude versus frequency, in that the segmented waveform comprises a plurality of individual segments that each exhibit: (a) a maximum amplitude and (b) a pair of minima amplitudes, wherein the plurality of output frequencies is modulated at a rate greater than a lower bound that is dependent upon: a predetermined offset value, threshold value, and harmonic separation, and which takes into account pass-band limit of overall selectivity of a receiver used to test the segmented spectrum clock generator.

In accordance with a further aspect of the present invention, a method for controlling a segmented spectrum clock generator circuit at a modulation frequency below an upper bound provides a clock signal to a frequency synthesizer circuit, and provides a controller, in which the frequency synthesizer under control of the controller generates a plurality of output frequencies over time; and the plurality of output frequencies are modulated over at least one time interval according to a modulation profile, such that a frequency response of the plurality of output frequencies exhibits a segmented waveform over a spectrum of amplitude versus frequency, in that the segmented waveform comprises a plurality of individual segments that each exhibit: (a) a maximum amplitude and (b) a pair of minima amplitudes, wherein the plurality of output frequencies is modulated at a rate less than an upper bound that is dependent upon: clock frequency, frequency deviation, and a predetermined clock harmonic where attenuation is desired.

In accordance with still a further aspect of the present invention, a segmented spectrum clock generator circuit is provided comprising a controller and a frequency synthesizer circuit having a clock signal input, the frequency synthesizer under control of the controller generating a plurality of output frequencies over time according to a modulation profile, such that a frequency response of the plurality of output frequencies exhibits a segmented waveform over a spectrum of amplitude vs. frequency, in that the segmented waveform comprises a plurality of individual segments that each exhibit: (a) a maximum amplitude and (b) a pair of minima amplitudes, wherein a slope of the frequency response between the maximum amplitude and each of the pair of minima amplitudes exhibits a 10 dB rolloff at a predetermined frequency difference from a center frequency of the individual segment.

Still other advantages of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE PREFERRED EMBODIMENT

Figure 1:
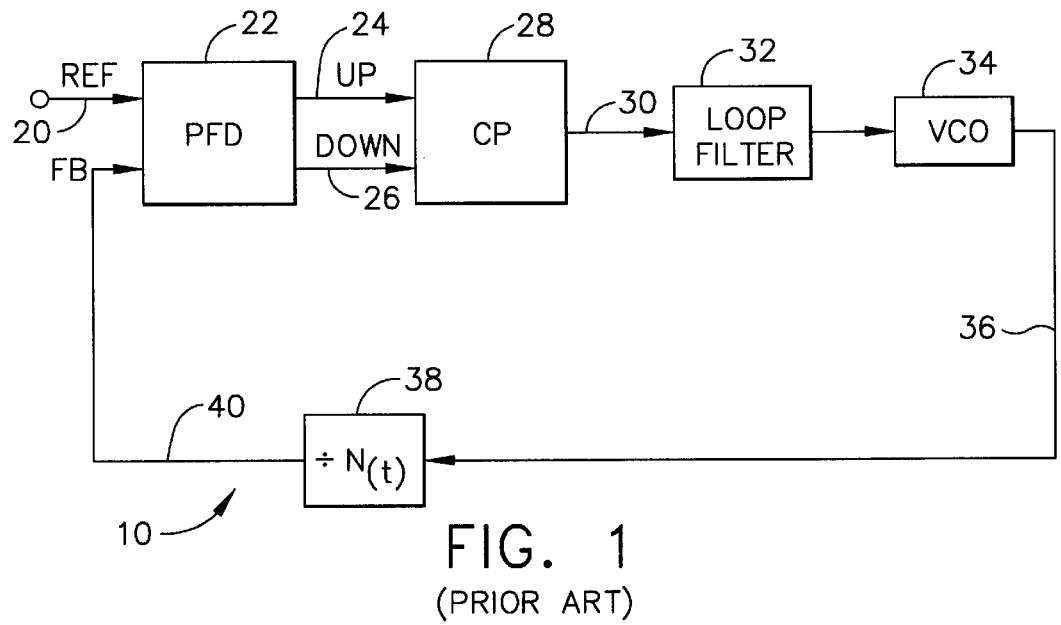
FIG. 1 is a block diagram of a prior art Phase Locked Loop circuit having a divide-by-N circuit that varies its value for N over time.

Reference will now be made in detail to the present preferred embodiment of the invention, an example of which is illustrated in the accompanying drawings, wherein like numerals indicate the same elements throughout the views.

A segmented spectrum clock generator is provided that uses a frequency synthesizer circuit to produce a frequency output that is varied by a modulation profile. The modulation profile is controlled by a table of data stored in a memory device, such as RAM, and this table of data is entered into a feedback counter at appropriate time intervals to create a clock frequency that changes its frequency value upon command, essentially due to new values placed into the feedback counter of this frequency synthesizer circuit. (The feedforward or reference counter can be used to change the frequency as well. A combination of both feedback and feedforward counters can also be used together. In general the feedback counter is preferred since it gives better resolution for the modulation profile. From here on, it shall be understood that the reference to feedback counter modulation may be substituted with feedforward and/or feedback counter.) In the preferred embodiment, the frequency synthesizer circuit is a Phase Locked Loop (PLL) which itself is driven by a constant frequency clock, typically provided by a crystal oscillator.

A preferred segmented spectrum profile has rather distinct peaks and valleys in the frequency domain, and whose modulation profile has a graphical appearance of frequency versus time that is somewhat "peaky" (see FIG. 4), although many other profile shapes could instead be used. These profiles are created and controlled by introducing a different value for the feedback counter, which forces a new frequency or phase to be emitted by the Voltage Controlled Oscillator (VCO), which is caused by forcing the Phase Frequency Detector (PFD) circuit to output either UP or DOWN pulses to the charge pump. In the preferred profile, there are multiple time intervals that successively cause a new frequency to be emitted by the VCO, and it is preferred that the profile continuously repeat the same intervals. The frequency with which the profile repeats is the modulation frequency. This frequency is the separation between the peaks in the frequency spectrum in FIG. 10. As the modulation frequency is increased, the separation between peaks in the frequency spectrum will increase. This relationship can be easily derived from the Fourier series representation of the frequency modulated squarewave clock signal. While it is possible to "modulate" the modulation frequency of the segmented spectrum clock generator circuit, it is preferred that the modulation frequency instead be very stable for many commercial applications.

To make the hardware circuit design more universally useable for various applications, a large number of pre-divider and post-divider circuits are used on both sides of the feedback counter, and furthermore the divider circuits are themselves programmable by use of registers that provide the divisor value, in which the registers can be loaded with different numeric values under control of a microprocessor or under control of a logic state machine. The preferred electronic circuit to implement the segmented spectrum clock generator also includes other registers to make the circuit more designer-friendly, including a Base Register to keep the size of the memory device storing the table of data to a minimum size, and also a Start Register that enables the system to use RAM instead of non-volatile memory upon initialization. Moreover, the preferred circuit includes a Reset Sync input and a Sync Out output signal, which enables the segmented spectrum clock generator to be synchronized with either downstream or upstream circuits.

It is preferred to use a microprocessor-type circuit along with a computer program to control the numeric values loaded into the various registers and counters of the segmented spectrum clock generator circuit. Alternatively, hardware logic without a microprocessor or other sequential programmable device could be instead used, so long as it has the capability of sequentially placing the correct values into the feedback counter. A logic state machine could be utilized to implement a non-microprocessor embodiment of the present invention. In both cases, a large number of logic gates and other types of digital circuits are typically used, and these preferably are provided within a single integrated circuit, such as an ASIC (Application Specific Integrated Circuit). An ASIC is a very economical way of providing a large number of logic gates, and can even include a microprocessor with Random Access Memory (RAM).

In the embodiment using a processing circuit (such as a microprocessor built within an ASIC), the sequential logic of the processing circuit is used to index through a table of data stored either in Random Access Memory (RAM) or Read Only Memory (ROM), and the contents of the table will be sequentially directed into an adder circuit (to provide a "Base Number" offset), the contents of which are then loaded into the feedback counter. In this manner, the processing circuit completely controls in real time the values, which in turn completely controls the feedback signal fed into the PFD input. This, in turn, controls the UP and DOWN signals that are fed into the charge pump which thereby controls the magnitude of the output current that is fed into the VCO.

If the present invention is implemented using a non-processing circuit solution, a logic state machine preferably is used to control the feedback counter values. The state machine must also be capable of properly loading the various registers throughout the segmented spectrum clock generator circuit, and further must be able to control an initial loading of numeric values into the look-up table stored in RAM (or other type of volatile memory device, such as a group of registers).

The output frequency from the frequency synthesizer of the preferred circuit (i.e., a Phase Locked Loop in the preferred embodiment) is varied using a modulation profile, of which several different profiles are disclosed hereinbelow. An "ideal Lexmark profile" is the preferred embodiment, which is also disclosed in detail below. In order to produce a segmented spectrum frequency response, it is expected that the modulation frequency at which the modulation profile is operated must be much higher than for most conventional spread spectrum clock generator circuits.

The segmented clock output signal must have multiple segments that exhibit a sharp rolloff on both sides of each individual segment's peak amplitude across the entire frequency spectrum. In order to meet proposed new rules (i.e., the CISPR-22 proposed rules), each segment must roll off by at least 10 dB at adjacent frequencies that are +150 kHz on both sides of (or offset from) each of the peaks.

The modulating frequency at which the modulation profile is operated has a lower bound that would theoretically be at 150 kHz. However, due to the reality that receivers are not ideal, this lower bound must take into account the type of receiver that will be used in the EMI emissions tests. With that in mind, the lower bound will typically be at least 160 kHz (for the very best receivers), and could be much greater. An empirically derived equation is provided hereinbelow to determine the lower bound, which is based upon a predetermined threshold value at which the frequency response rolls off from a peak at each segment.

In addition to the lower bound, the present invention also defines an upper bound for the modulation frequency at which the modulation profile is operated. This upper bound is provided in an equation format hereinbelow, and is a function of clock frequency, frequency deviation, and the clock harmonic where attenuation is necessary. Furthermore, a factor in determining the upper bound is the shape of the modulation profile. Various modulation profiles can be used, including the ideal Lexmark profile.

Referring now to the drawings, FIG. 1 depicts a conventional Phase Locked Loop (PLL) known in the prior art, and generally depicted by the reference numeral 10. A reference signal at 20 is directed to an input of a Phase Frequency Detector (PFD) 22, which also has a second "feedback" input at 40. PFD 22 outputs two signals called UP and DOWN, respectively at the reference numerals 24 and 26, which are connected to the input of a charge pump (CP) 28.

The charge pump current is an output at 30 that is directed to a loop filter 32 that conditions the signal before sending it on to a Voltage Controlled Oscillator (VCO) 34. The output of VCO 34 is a frequency signal that is proportional to the output voltage of the charge pump at 30. The output 36 of VCO 34 is directed to a divide-by-N circuit 38, which typically is implemented as a divide-by-N counter, and which will output a pulse after receiving a cumulative total of N input pulses. The output of the N counter 38 is directed to the input of the PFD 22 as the feedback signal 40.

If the value of N for the N counter 38 remains constant, then the PLL circuit 10 will behave as a standard PLL. However, for use in the present invention, the value for N in the N counter 38 is varied over time, and consequently on FIG. 1 the depicted block at 38 carries the designation of N(t), signifying that the value of N varies over time. As is known in the prior art, this variance of N can be controlled by some type of processing circuit (such as under control of a microprocessor), or it can be controlled by a hardware logic circuit that contains no central processing unit. (As previously stated, a combination of changing the reference frequency by a counter and/or feedback counters may be used to vary the PLL output frequency.)

Figure 2:
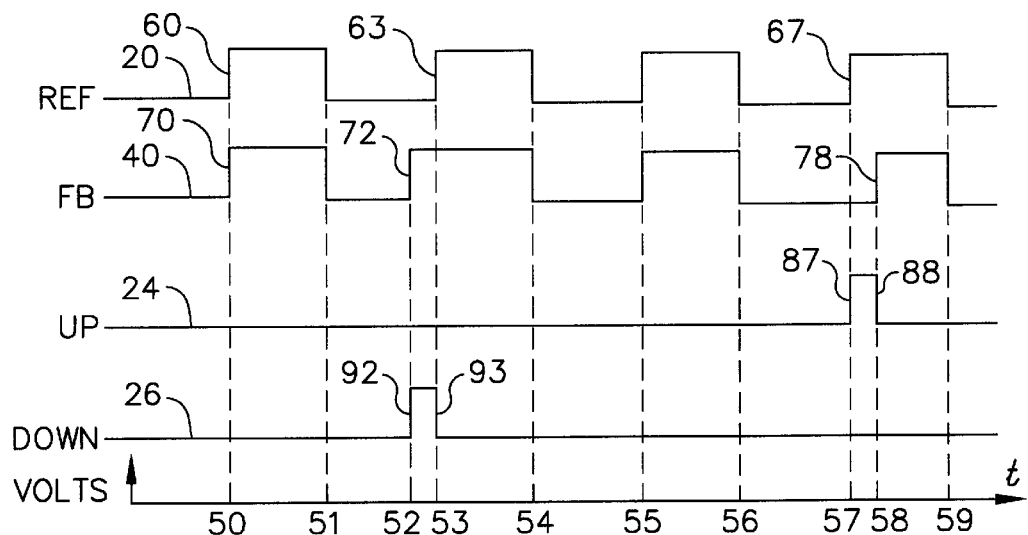
FIG. 2 is a timing diagram showing the relationship of some of the signals of the circuit disclosed in FIG. 1.

FIG. 2 illustrates the waveform of some of the signals that are used in the PLL 10 of FIG. 1. In FIG. 2, the reference signal (REF) 20, feedback signal (FB) 40, UP signal 24, and DOWN signal 26 are depicted as voltage signals along the vertical or Y-axis versus time (along the horizontal or X-axis). The graphs of FIG. 2 are presented mainly to illustrate the generation of the UP and DOWN signals 24 and 26, respectively, in the prior art PLL circuit 10.

Starting at a time mark 50 along the X-axis, the reference signal 20 makes a positive transition at 60, and the feedback signal 40 makes a similar positive transition at 70. Since both of these transitions at 60 and 70 take place at substantially the same time (i.e., at time mark 50), there is no logic transition in either the UP or DOWN signals 24 and 26. At the time mark 51 along the X-axis, the reference and feedback signals 20 and 40 make a negative logic transition back to Logic 0.

At the next time mark 52, the feedback signal 40 makes a positive transition at 72 from Logic 0 to Logic 1, which occurs in time before the reference signal 20 makes its next Logic 1 transition at 63 (i.e., at time mark 53). In phase locked loop vernacular, the Phase Frequency Detector (PFD) 22 must now conclude that the VCO is running too fast, because its effective output pulse, which becomes the feedback signal 40, arrived too early in time, since it arrived before the positive transition of the reference signal at 63. Consequently, the PFD 22 will generate a DOWN Pulse (i.e., to "slow down" the VCO), as can be seen at the logic transitions at 92 and 93 on the DOWN signal graph on FIG. 2. The pulse widths of the UP or DOWN signals represents the time difference between the positive transitions of the feedback signal 40 and the reference signal 63.

In the example of FIG. 2, the reference and feedback signals make a negative transition at the time mark 54, and both of these signals then make a positive logic transition virtually simultaneously at the time mark 55. Consequently, there is no UP or DOWN signal transition at time mark 55. At the time mark 56, both the reference and feedback signals again make a negative logic transition.

In the example of FIG. 2, the reference signal 20 makes a positive logic transition at 67, however, the feedback signal 40 does not make its next positive logic transition until later in time, at 78. Since the reference signal logic transition 67 occurs at a time mark 57, which is earlier in time than the next time mark at 58 (which is when the feedback signal makes its logic transition at 78) an UP pulse will be generated by the PFD 22 at the time mark 57. This is shown on FIG. 2 where the UP signal 24 makes a transition to Logic 1 at 87, and remains at the high logic level until it makes a negative transition to Logic 0 at 88. Both the reference and feedback signals make a negative logic transition virtually simultaneously at a time mark 59.

In practice PLL 10 filters the UP and DOWN signals in loop filter 32, resulting in generally continuous changes in the output frequency of VCO 34, but with variations in spectral amplitudes at the frequency of the modulation as described in the following.

Figure 3:
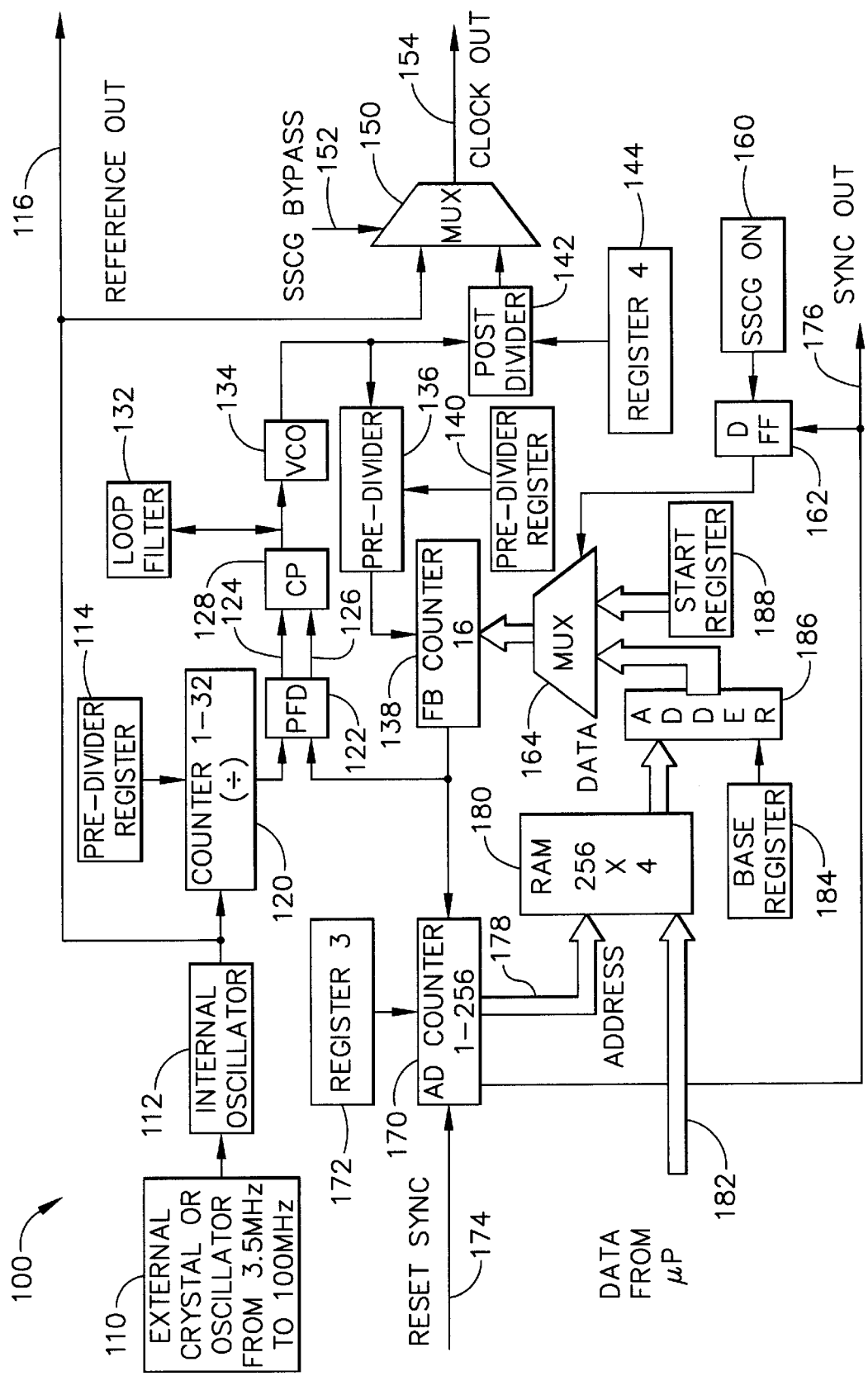
FIG. 3 is a block diagram of a segmented spectrum clock generator circuit, using a Phase Locked Loop, as constructed according to the principles of the present invention.

Referring now to FIG. 3, a segmented spectrum clock generator circuit 100 is based upon a PLL circuit similar to that depicted in FIG. 1. Any type of frequency synthesis circuit could be used in the present invention, particularly one that operates using digital electronic circuitry. For example, instead of a phase locked loop, a digital locked loop circuit or a delay locked loop circuit could be utilized, or the previously mentioned modulating methodology may be used. In FIG. 3, the PLL circuit is primarily made up of a PFD 122, charge pump 128, loop filter 132, VCO 134, and a feedback ("FB") counter 138. In this illustrated embodiment, the feedback counter is capable of counting up to sixteen (16) before changing its output state, and therefore, can act as a divide-by-N circuit where N can be in the range of 1–16.

The PFD has an UP output at 124, and a DOWN output at 126. The output of the charge pump 128 is run through or in parallel with the loop filter 132, and into the input of the VCO 134. The output of VCO 134 preferably is directed to both a pre-divider circuit at 136 and a post-divider circuit at 142. These dividers 136 and 142 are useful in further scaling the frequency that will be presented to other parts of the circuit in the segmented spectrum clock generator circuit 100. The pre-divider 136 is capable of dividing a frequency by an integer number, and its divider value (e.g., the value for "N" when the pre-divider 136 is a divide-by-N counter) preferably is capable of being loaded by an external device. In FIG. 3, a pre-divider register at 140 is the device that loads the value for N into pre-divider 136. Similarly, a Register #4 at 144 loads the divider value "M" into the post-divider circuit 142.

A very accurate external crystal or oscillator circuit is provided at 110 which produces a constant frequency output that can be modified by an internal oscillator at 112. Alternatively, the "external crystal" at 110 can represent a single crystal clock device as purchased from a manufacturer, and the "internal oscillator" at 112 can represent the support circuitry for the crystal itself at 110. The preferred output from the "internal oscillator" at 112 is 48 MHz, which is provided to a counter circuit at 120 and is also provided as a constant frequency reference output at 116.

If the "internal oscillator" at 112 is provided as a separate frequency synthesizer circuit, such as another phase locked loop, then the external crystal at 110 can have a very wide range of frequencies, such as in the range from 3.5 MHz to 100 MHz (or even wider, if desired), and the internal oscillator at 112 in that case could modify that crystal frequency to whatever fixed reference frequency is desired for a particular application.

The reference frequency at 116 is also provided to a multiplexer 150 in FIG. 3, and the clock output of the entire circuit 100 is provided as the output of the multiplexer at 154, which can either be the reference frequency at 116, or the output of the post-divider circuit at 142, depending upon the state of the logic signal that is provided as an input at 152 to the multiplexer 150. On FIG. 3, the logic control signal 152 is labeled as "SSCG Bypass," since the use of this logic signal at 152 can "bypass" the segmented spectrum clock generator circuit by instead choosing the constant frequency reference output that is provided at 116.

The counter 120 is capable of dividing the frequency by an integer, and in the illustrated embodiment of FIG. 3, this counter 120 has a range of division between one (1) and thirty-two (32). The value for the divisor "P" in counter 120 can be loaded from a register at 114, which is referred to on FIG. 3 as a pre-divider register. In this manner, the value for P in counter 120 can be made programmable.

As noted above, the frequency of the clock signal directed to the counter 120 preferably is 48 MHz, which can be achieved by a crystal clock oscillator composed of the external crystal itself at 110 and the support circuitry at 112. The pre-divider register at 114 is preferably set to a value of two (2), which directs the counter 120 to change state at a rate such that it provides a 24 MHz reference frequency to the PFD circuit 122. PFD 122 provides the UP and DOWN signals to the charge pump 128, which preferably is a current sourced charge pump that provides 25 $\mu$A to the loop filter 132 and voltage control oscillator 134. It will be understood that the above-described operating frequencies are merely preferred examples, and much higher or lower frequencies could be utilized by the circuit and methodology of the present invention. It will be understood that the charge pump could be either a current source or a voltage source, and it can either source or sink current, depending upon the desired direction of current flow The main PLL of FIG. 3 consists of several major components, including the PFD 124, charge pump 128, loop filter 132, VCO 134, pre-divider 136, and feedback counter 138. This PLL is a third order device and preferably has the following characteristics: (as noted above) the charge pump is a current source at 25 $\mu$A; the voltage controlled oscillator (VCO) 134 has a gain of 143 MHz/volts, and the preferred output frequency is 266.4 MHz; the loop filter 132 comprises a 36 pF capacitor with a series resistor of 10 kOhms, and an 850 pF capacitor in parallel with the 36 pF capacitor and 10 kOhms resistor; the pre-divider 136 will preferably have a divisor of one (1), which is loaded by the pre-divider register 140; and the feedback counter 138 preferably has a range from 1–16. (Depending on the desired mode of operation one skilled in the art would recognize that many different combinations of component values may be used to create similar results.)

The auxiliary components that also affect the feedback counter 138 include a Random Access Memory (RAM) circuit 180, a Base Register 184, and a Start Register 188. These components provide numeric values to the feedback counter 138 that control the segmented spectrum profile that modulates the output frequency at 154. The memory device 180 is loaded with values from an address counter 170, and also can be loaded with address values directly from a microprocessor over an address bus at 182. Moreover, a control signal that is latched by a D flip-flop 162 causes the segmented spectrum clock generator circuit to begin and then continue to operate.

The address counter 170 will preferably count up to 256 address values, and provides those values on its output bus 178 into the RAM device 180. This occurs under control of the count value that is output from the feedback counter 138. It is also under the control of a value that is input from a Register #3 at 172. The numeric value that is loaded into Register #3 represents the number of addresses that are to be used by the look-up table in the RAM device 180. In the preferred mode of the present invention, this numeric value is equal to 114, decimal. Address counter 170 will therefore count sequentially (and repeatedly) through the number of addresses that are used by the table within the RAM device 180, and this numeric value is set by Register #3 at 172. Every time a pulse is emitted from the output of feedback counter 138, the address counter at 170 counts another incremental value and will then output a new numeric value on its output bus at 178 into the RAM table. This numeric value on bus 178 represents an address pointer that points into a specific memory location within the RAM device 180.

Another signal that affects the address counter 170 is a "Reset Sync" signal at 174. When this Reset Sync signal at 174 goes active, it will cause the address counter's output to be reset to its initial value. Typically, that initial value will be set to a count value of zero (0), however, the system architecture of FIG. 3 allows for the initial value to be any numeric value in the range 0–255. This Reset Sync signal allows an upstream clock circuit to control the starting value and timing of the segmented spectrum clock generator circuit 100 of FIG. 3. This could be useful when multiple segmented clock generator circuits are desired that are to be synchronized with one another, or could even be used with a different type of clock generator circuit such as a spread spectrum clock generator. Moreover, the segmented spectrum clock circuit 100 of FIG. 3 also includes a "Sync Out" signal at 176 that can be used to synchronize further downstream clock generator circuits, including spread spectrum clock generators or other segmented spectrum clock generators, or virtually any other type of digital clock device.

Upon initialization of the segmented spectrum clock generator circuit 100, the system microprocessor will provide an initial load of zeros (0's) into the RAM device 180. Once a power-on reset sequence has successfully occurred, the microprocessor will then load the RAM 180 with a predetermined set of numbers that are associated with a particular desired frequency and deviation output. In the illustrated embodiment of FIG. 3, the RAM device 180 comprises a RAM circuit having 256 rows by 4 columns, which allows for 4-bit precision, and has 256 such values as a maximum. As noted hereinabove, in the illustrated embodiment only 114 of these memory locations are utilized by the address counter 170.

It will be understood that other types of memory devices besides RAM could be utilized for the memory device 180 in the clock generator circuit 100 of FIG. 3. A ROM (Read Only Memory) could be used if it is definitely known that the numeric values in the table stored in the memory device 180 will never be changed for a particular application of this circuit 100. Moreover, a plurality of registers could be utilized, although they would have to be individually addressable by both the bus 182 and the bus 178 to be effective in the illustrated design of FIG. 3. In the case of a volatile memory device, such as RAM, other circuit components can be utilized to overcome certain shortcomings upon initialization of power of the circuit 100, such as the Start Register at 188. This will be discussed hereinbelow in greater detail.

If the numbers that need to be stored in the look-up table of the RAM memory device 180 are large in magnitude and the amount that the numbers vary from one another are relatively small in magnitude, then a base number can be added to the stored values to keep the memory size small of the RAM memory device 180. This is the reason that a 4-bit precision device can be used. This is accomplished by use of the Base Register 184 which provides a numeric value to an adder circuit 186. The output from the RAM memory device 180 is presented also to the adder circuit 186, and the output of this adder circuit 186 is the numeric sum of the RAM-provided numeric value and the Base Register numeric value.

It will be understood that adder circuit 186 will not be necessary if a base number is not required to keep the size of the RAM memory device 180 within a reasonable constraint. Of course, a larger memory chip could be used to eliminate the Base Register 184, but that would typically cost more money, either as a separate device, or as part of an ASIC that could be used to contain much if not all of the circuitry illustrated on FIG. 3.

If the address look-up table within the memory device 180 comprises actual RAM that is volatile, the circuit will initially start with blank numbers, or other unknown or unreliable values. This is the circumstance where the Start Register 188 will preferably be included to provide a realistic numeric value into the feedback counter 138 upon initialization. This will allow the feedback counter 138 to provide reasonable control characteristics upon a power-on reset condition. The Start Register 188 provides a numeric value to a multiplexer 164. Upon initialization, multiplexer 164 will preferably output values that are presented from this Start Register 188. Later, the multiplexer will output values that are provided from the adder circuit 186, which are also input to the multiplexer 164. Once that occurs, the numeric values in the RAM look-up table within the memory device 180 will directly control the feedback counter 138.

An "SSCG ON" register at 160 can be provided (either as a register or as an input from some external signal) which is used to select between a fixed or modulated adder amount. When activated, it presents a logic signal to a D flip-flop 162, which has an output that selects the desired input to the multiplexer 164. Upon initialization, the multiplexer 164 will be commanded to pay attention to the Start Register value instead of the value output from the adder 186. This portion of the clock generator circuit 100 could be used to start a segmented spectrum clock generator cycle when the address counter 170 reaches zero (0), which would be indicated by an output pulse on the Sync Out signal at 176. This Sync Out signal 176 is also used as the clock input to the D flip-flop 162.

As inferred above, if the address look-up table in the memory device 180 comprises ROM or some other type of non-volatile memory, then there will always be correct "real" numbers to work with, and the Start Register 188 will not be required. Moreover, in that situation the multiplexer 164 would also not be required. Naturally, various combinations of adder circuits and multiplexer circuits could be utilized in the segmented spectrum clock generator circuit 100 without departing from the principles of the present invention.

In the preferred embodiment, the Start Register 188 sets the frequency that the PLL will operate at when it is not looping through the look-up table values in the RAM memory device 180. Its preferred value is eleven (11), decimal.

The Base Register 184 provides a predetermined number associated with the look-up table values in the RAM memory device 180. It can be changed depending upon the desired frequency output deviation and base frequency values. In the preferred mode of the present invention, the look-up table comprises RAM having 4-bit elements that can store values between 0–15, decimal.

The post-divider circuit 142 has its value controlled by a Register #4 at 144. This Register #4 is loaded with a number associated with the desired output frequency, and preferably is set to a value of four (4). The post-divider circuit 142 thereby provides an output frequency of 66.6 MHz, in the illustrated embodiment of FIG. 3.

The registers that are illustrated on FIG. 3 could be replaced by hard logic in situations where it is known that the registers' numeric value will never change for a particular electronic application. However, to make the segmented spectrum clock generator circuit 100 as universally useful as possible, the registers are preferred over hard logic, and furthermore are directly addressable by a microprocessor or other type of state machine logic or sequential logic. In that way each of the registers can be provided with an appropriate numeric value for a specific application, yet the same hardware design can be used for multiple clock generator applications by use of appropriate numbers in the registers. In some circumstances, it may be desirable for the output clock frequency at the Clock Out signal 154 to operate in a different frequency domain, and the registers can be used for changing the divider circuits or various counters, where appropriate. This could also be used in combination with loading different values into the look-up table of the memory device 180 where that memory device is changeable, such as in the case of RAM memory or a group of registers.

Figure 4:
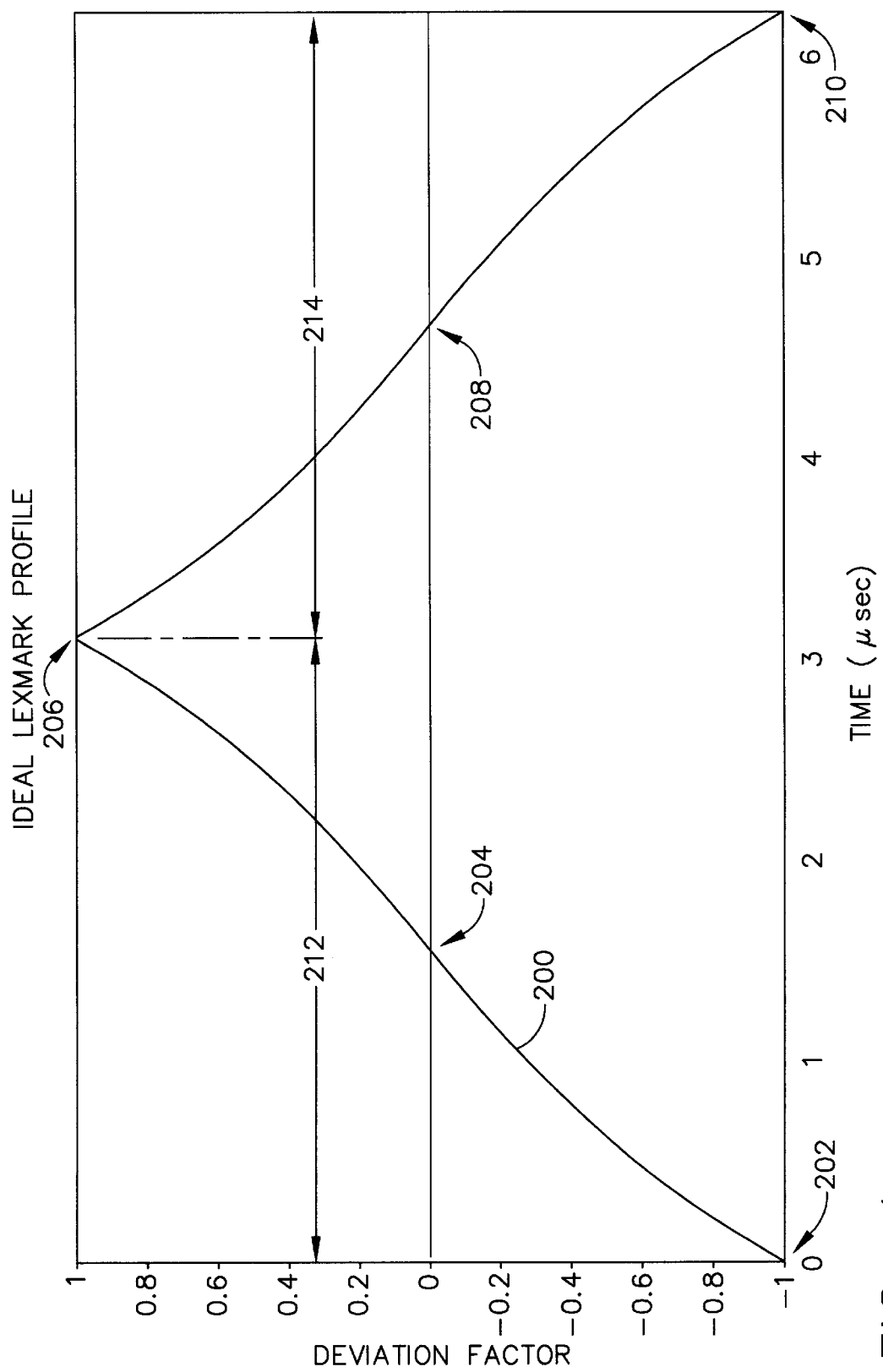
FIG. 4 is a graph of a preferred ideal profile of a segmented spectrum clock generator, as used in a Lexmark laser printer.

FIG. 4 illustrates an ideal "Lexmark" modulation profile for the preferred segmented spectrum clock generator of the present invention. This profile is indicated by the curve designated by the reference numeral 200, which starts at a left-hand minimum at 202, increases to a peak at 206, and then decreases to a right-hand minimum at 210. As can be seen from FIG. 4, the change in operating frequency (i.e., the "deviation factor" that is shown along the y-axis) is not a straight-line between the minimum points 202 or 210 and the maximum point at 206. Instead, the preferred profile is very similar to a spread spectrum profile disclosed in U.S. Pat. No. 5,872,807 (Booth '807) which discloses a clock circuit for generating a spread spectrum having certain mathematical qualities for its frequency response.

This Booth '807 patent is titled "Spread Spectrum Clock Generator and Associated Method," and is assigned to Lexmark International, Inc., and is incorporated herein by reference in its entirety. This patent mathematically describes certain parameters that can be used to define a periodic waveform that makes up the modulation profile, and the preferred "ideal Lexmark profile" of FIG. 4 in the present invention is very similar, although the scaling factor "p" in the present invention is preferably set to 0.75, whereas in the Booth '807 patent it was set to 0.55

The Booth '807 patent describes a clock circuit that generates a spread spectrum clock output signal having a fundamental frequency and reduced amplitude EMI spectral components at harmonics of the fundamental frequency. The spread spectrum clock generator includes a clock pulse generator that generates a series of clock pulses, and a spread spectrum modulator for frequency modulating the clock pulse generator to broaden and flatten amplitudes of EMI spectral components that would otherwise be produced by a standard clock pulse generator. The spread spectrum clock output signal is frequency modulated using specific profiles of frequency deviation values versus the period of the profile. One preferred modulation profile phase modulates the clock pulses with a periodic waveform having a percentage of phase deviation profile as a function of percentage of a period (% Period) of the periodic waveform within an envelope defined by predetermined upper and lower bound, and the upper bound for a second quadrant is defined by a quantity:

$$\Phi_3 = 100\%((\% \text{ Period}/25)^2 - 1);$$

the lower bound is defined by the quantity:

$$\Phi_4 = 100\%((\% \text{ Period}/25)^4 - 1).$$

For the first quadrant between −25% to 0% Period, the lower bound is equal to ($\Phi_4$(−% Period) and the upper bound is equal to $\Phi_3$(−% Period). For the third quadrant between 25% to 50% Period, the lower bound is equal to −$\Phi_3$(50−% Period), and the upper bound is equal to −$\Phi_4$(50−% Period). For the fourth quadrant, the lower bound is equal to −$\Phi_3$(% Period −50), and the upper bound is equal to −$\Phi_4$(% Period −50).

On FIG. 4, the nominal frequency is indicated along the y-axis value of zero (0), and in the left-hand portion of the profile where the slope is positive, the profile crosses this line at 204; on the right-hand portion of the profile where the slope is negative, the profile crosses the nominal frequency at 208. The amount of inflection is somewhat reduced in the "ideal Lexmark profile" illustrated on FIG. 4 as compared to the Booth '807 patent, although the left-hand portion 212 is virtually identical to the right-hand portion 214 with respect to the symmetry of the curves.

Figure 5:
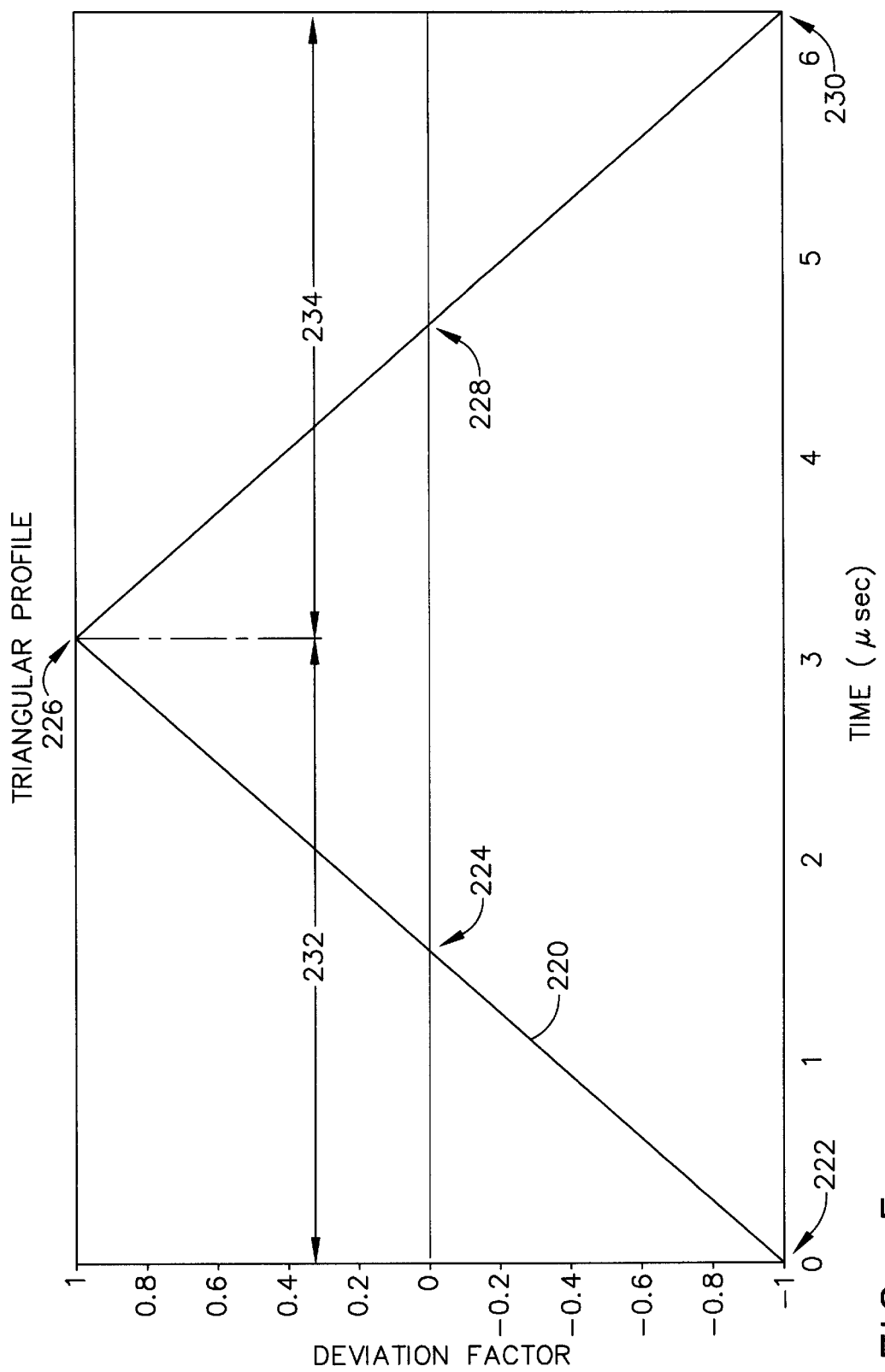
FIG. 5 is a graph of a simulated triangular profile of a segmented spectrum clock generator.

FIG. 5 illustrates a modulation profile useful in the present invention in which the profile is triangular in shape when viewed on a graph of frequency versus time. This curve for the triangular profile is indicated at 220, and has a first minima at 222, a maximum at 226, and a second minima at 230. The profile crosses the nominal or fundamental frequency at two points, at 224 and 228. Furthermore, the triangular profile 220 is symmetrical in its left-hand portion 232 as compared to its right-hand portion 234.

Figure 6:
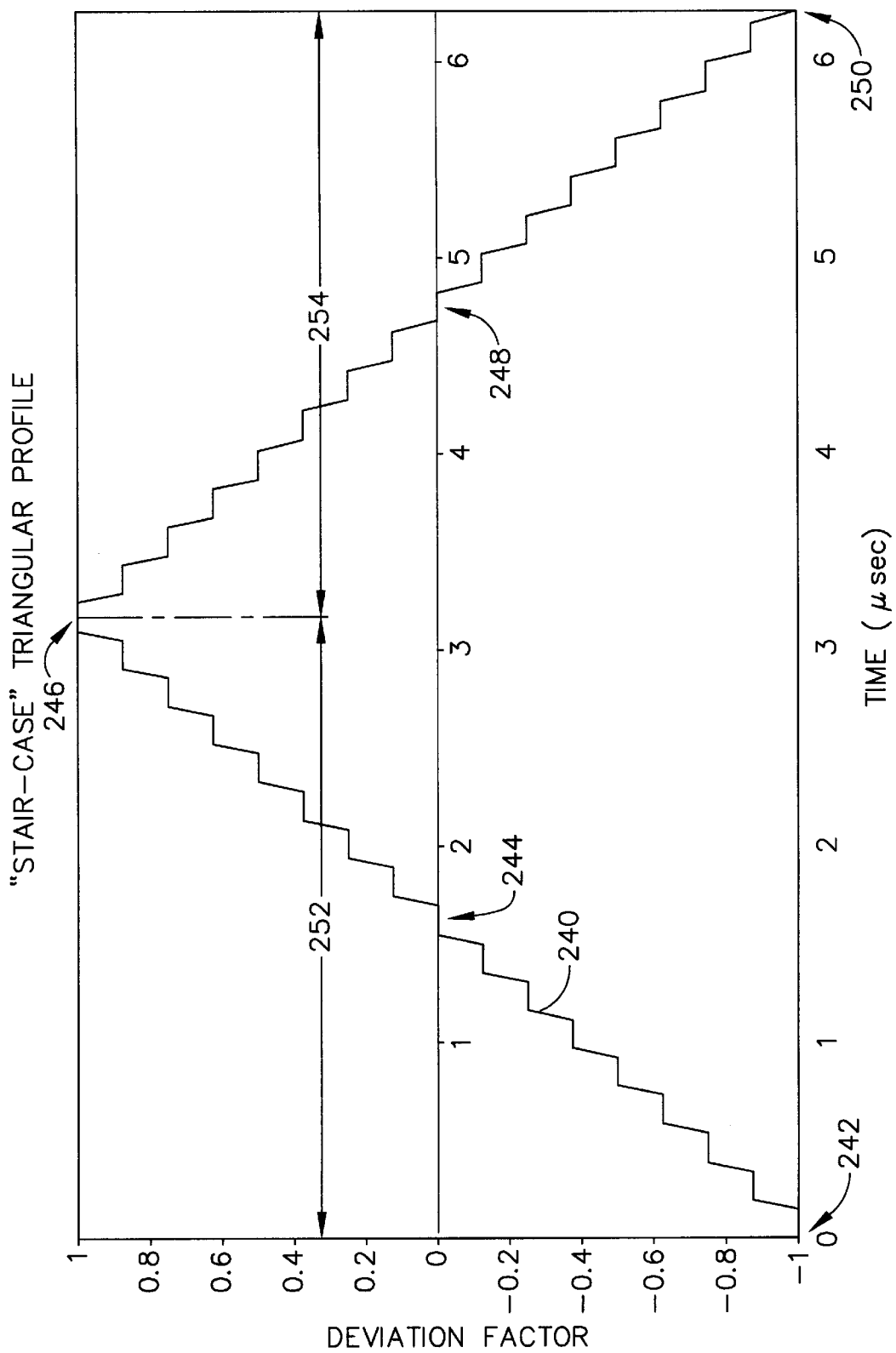
FIG. 6 is a graph of a staircase triangular profile of a segmented spectrum clock generator.

A staircase triangular modulation profile is illustrated in FIG. 6, which also could be useful in the present invention. On FIG. 6, this profile curve is indicated by the reference numeral 240, and has a starting point at a first minima at 242, a maximum at 246, and an ending or second minima at 250. The profile curve 240 crosses the fundamental frequency at two locations, indicated at 244 and 248. The left-hand portion 252 of this curve 240 is symmetrical with the right-hand portion 254, although this symmetry is not necessary in all profiles used with the present invention. Also, the number of steps shown in FIG. 6 should not be taken as limiting how many steps are used. Other embodiments may use as few as two steps.

Figure 7:
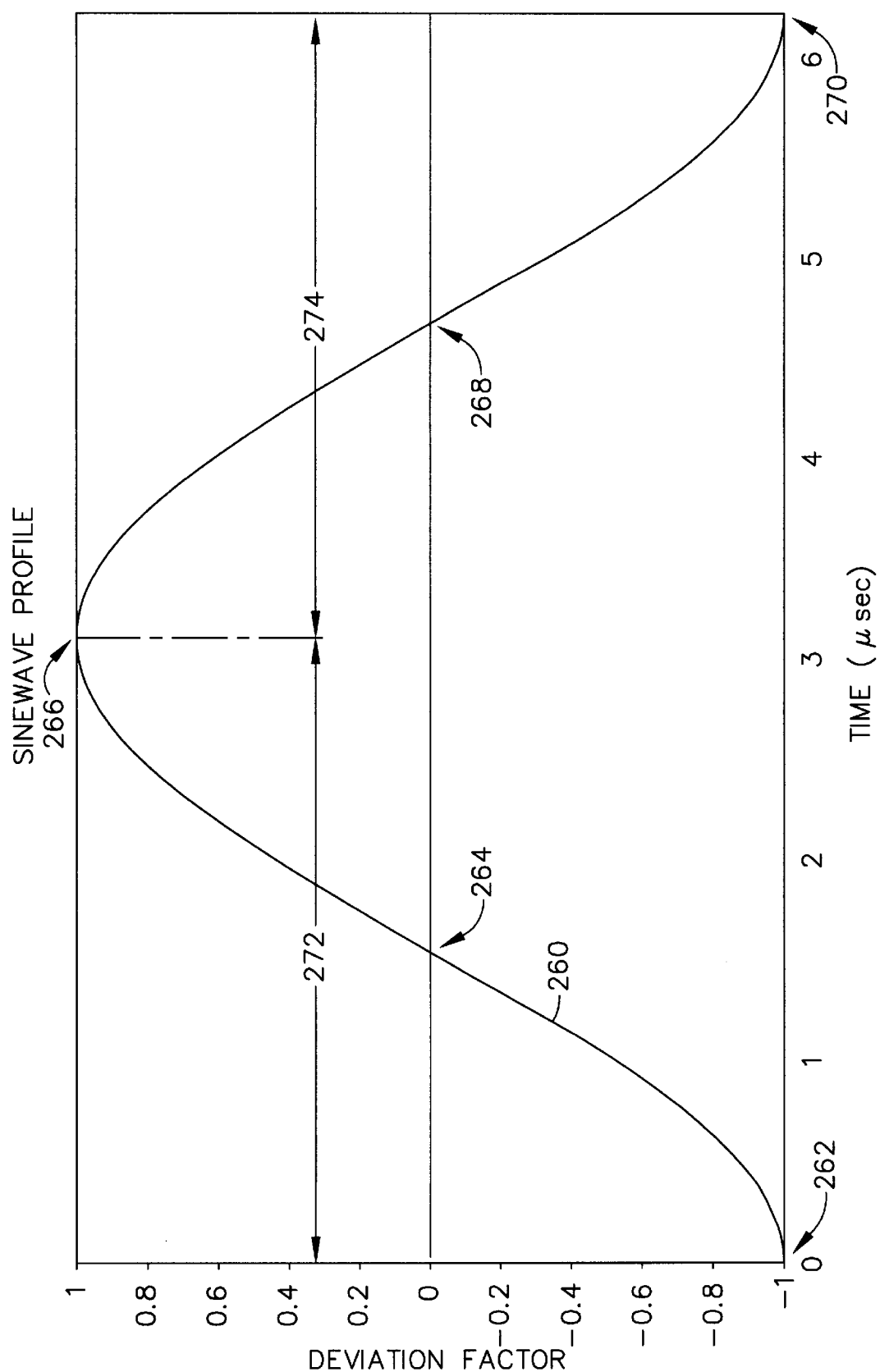
FIG. 7 is a graph of a sine wave profile of a segmented spectrum clock generator.

FIG. 7 indicates a sine wave modulation profile, having a first minima at 262, a maximum at 266, and a second minima at 270. The profile curve itself is designated by the reference numeral 260, and crosses the fundamental frequency at two points, 264 and 268. Once again, the left-hand portion 272 is symmetrical with the right-hand portion 274.

Figure 8:
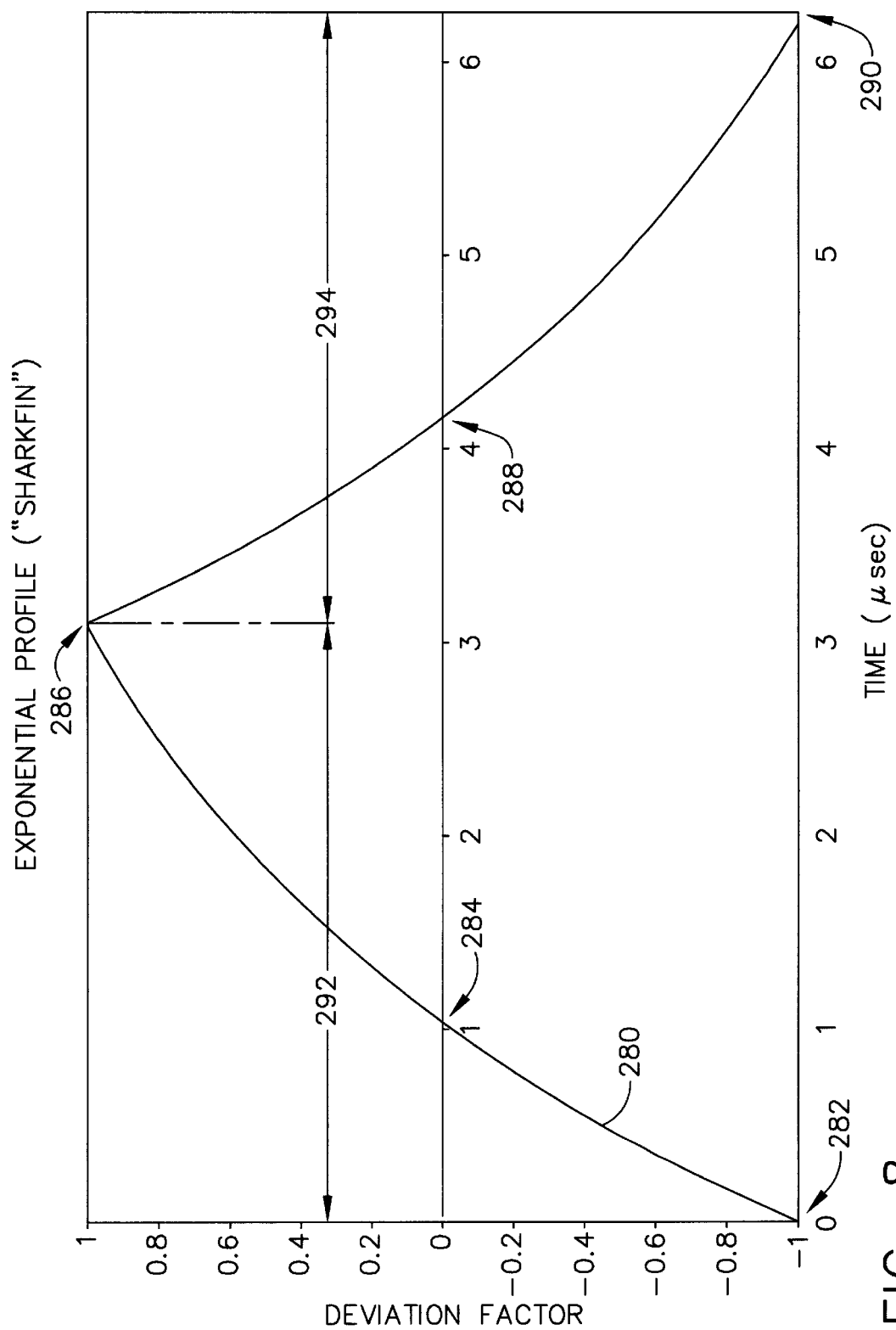
FIG. 8 is a graph of an exponential profile of a segmented spectrum clock generator.

The present invention would even work with an exponential modulation profile as illustrated on FIG. 8, in which a "shark fin" curve 280 has a first minima at 282, a maximum at 286, and a second minima at 290. This profile curve 280 crosses the fundamental frequency at 284 and 288, and its left-hand portion 292 and right-hand portion 294 are symmetrical, although they are symmetrical in opposite quadrants with respect to the y-axis and with respect to the changes in slope of the curve 280.

Figure 9:
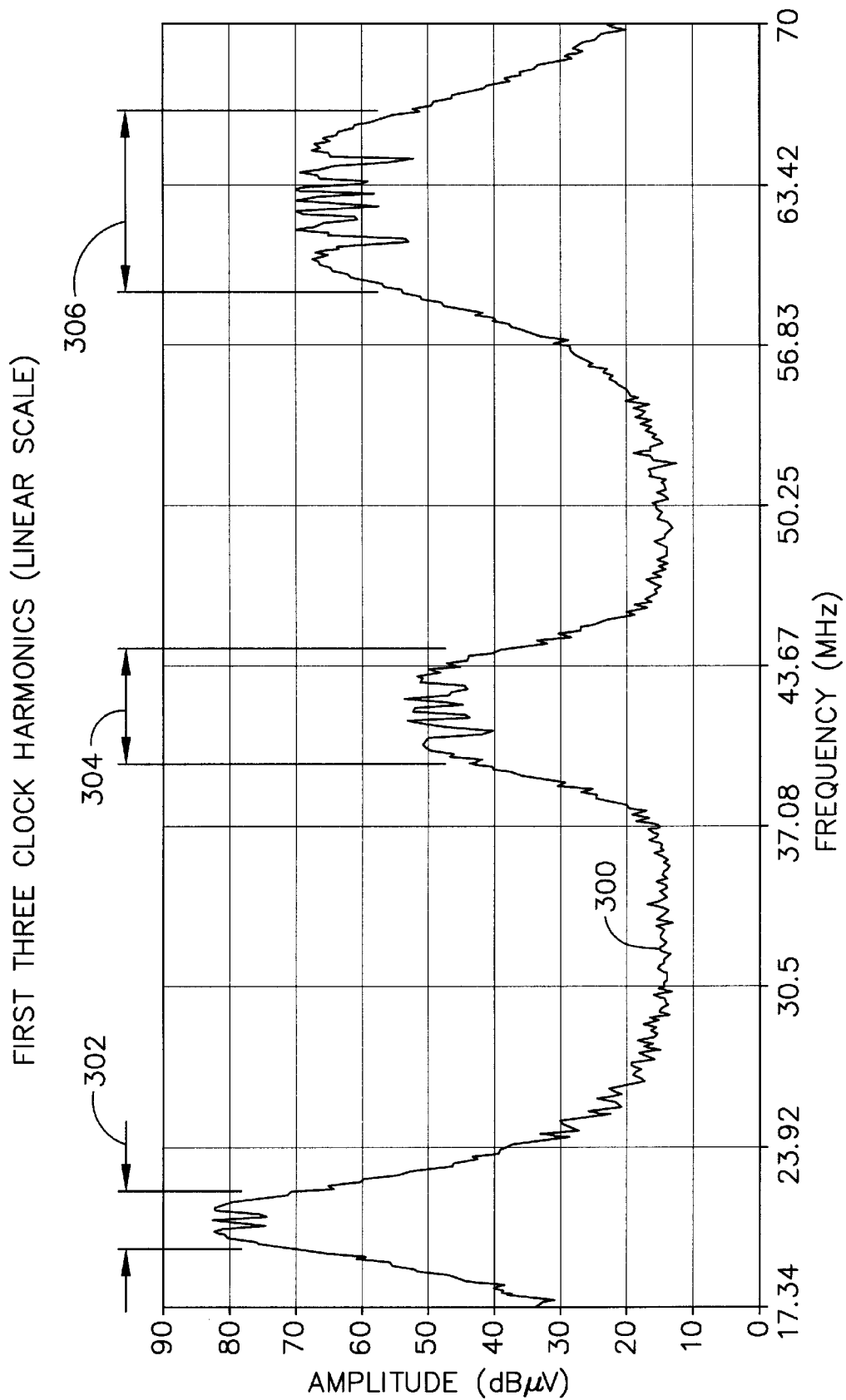
FIG. 9 is a graph showing the frequency spectrum produced by a preferred segmented spectrum clock generator, showing the first three clock harmonics.

FIG. 9 illustrates a frequency spectrum curve 300 of the segmented spectrum clock generator output for its fundamental frequency, and its first two harmonics. The fundamental frequency is about 20 MHz, and is depicted as having its maximum amplitude in the band designated by the reference numeral 302. The spectrum plot on FIG. 9 continues at the higher frequencies, as seen by curve 300, until reaching its second harmonic, which has its maximum amplitude in a band that is designated by the reference numeral 304. The spectrum response curve 300 continues until reaching its third harmonic maximum, which exhibits a band that is designated by the reference numeral 306. Naturally, the spectrum response curve 300 continues in higher frequencies that are off of this chart of FIG. 9, but which would generally have lower amplitudes than the first three bands depicted on FIG. 9.

Figure 10:
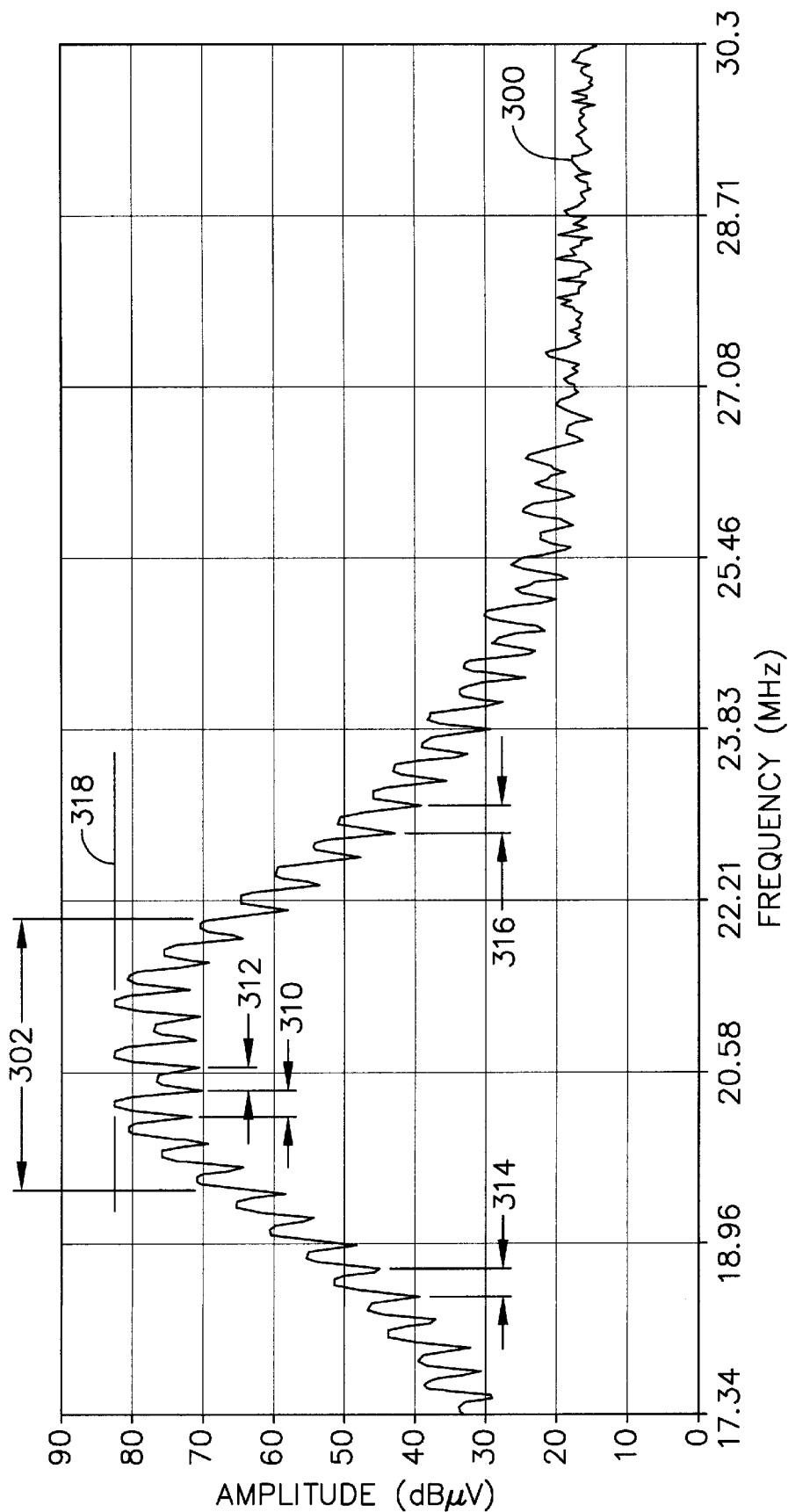
FIG. 10 is a graph showing the frequency spectrum produced by a preferred segmented spectrum clock generator, showing the fundamental frequency (i.e., first harmonic) on an expanded x-axis.

FIG. 10 is another graph of the frequency response curve 300 for the portion of the spectrum that is in the area of the fundamental frequency (or first harmonic). The frequency response curve 300 is again illustrated, however the x-axis has been expanded to show greater detail. The overall maximum amplitude at the fundamental frequency is shown as the band designated by reference numeral 302.

As can be seen on FIG. 10, the frequency response curve 300 is divided or segmented into multiple individual harmonics (referred to hereinafter as individual "segments") within a sideband that have a general appearance in combination of distorted sine waves across the frequency spectrum. For example, the segment at 314 is illustrated as being around 18 MHz, and has a bandwidth of approximately 240 kHz. The frequency spectrum can be seen as being mainly composed of a large multiple of segmented single segments that are quite apparent near the first harmonic frequency. Other such segments are indicated at the reference numerals 310 and 312 that are very close to the center frequency, and another such single segment is designated at 316 that is at a greater frequency than the fundamental.

One of the main points of using the segmented spectrum clock generator circuit 100 as illustrated in FIG. 3 is to modulate the clock frequency so as to produce this segmented spectrum, as seen on FIG. 10. If the modulation frequency is at 240 kHz, then each of the single segments that are illustrated on FIG. 10 will also be substantially 240 kHz in bandwidth. The term "bandwidth" in this usage refers to the lower valley on one end of the single segment through a greater frequency until reaching another valley that defines the opposite end of the single segment. As can be seen in FIG. 10, these valleys will not necessarily be at the same amplitude, as is clearly the case for the segments at 314 and 316. Therefore, the "bandwidth" of each individual segments is not defined by a particular rolloff point along the slope of the spectrum, but in this usage refers to the negative "peak" (or valley) before the amplitude again rises at the next segment within the frequency spectrum of the curve 300.

The segments illustrated at 310 and 312 have nearly equal minimum valleys at the ends of both of these single segments, however, their individual maximums are at different amplitudes, as can be easily seen on FIG. 10. The segment 310 has a maximum around 82 dBuV, as is clearly indicated by the horizontal line 318 on FIG. 10. This represents the maximum amplitude for the entire frequency response of the segmented spectrum clock signal, and must, of course, be less than the maximum allowable emissions when being tested under the appropriate standard, whether an FCC standard or a CISPR standard. On FIG. 10, it can be seen that there are two other segments that have nearly identical peaks that approach this upper limit along the horizontal line 318. The segment 312 does not have that same maximum amplitude, yet it still has the same bandwidth as being defined herein as do the two segments on either side of the segment 312 (including the segment to its left at 310).

To meet the proposed CISPR-22 rule, a rolloff of at least 10 dB must occur on both sides of each peak of the segmented spectrum clock frequency response. This 10 dB rolloff must occur at the points that are +150 kHz and at −150 kHz from the peak center frequency. This will be discussed in greater detail hereinbelow, and a more detailed graphical example is provided on FIG. 13.

Figure 11:
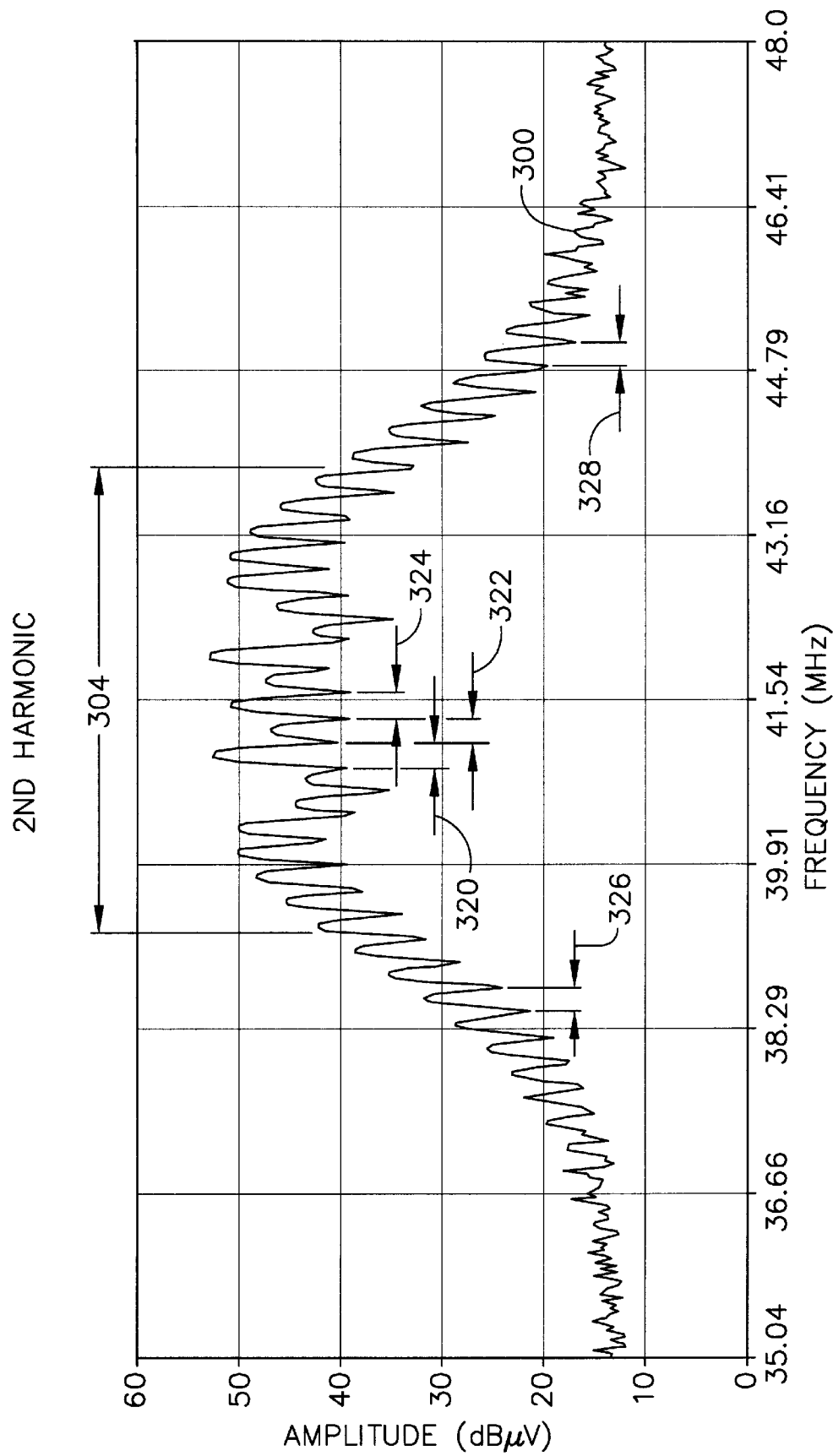
FIG. 11 is a graph showing the frequency spectrum produced by a preferred segmented spectrum clock generator, showing the second harmonic on an expanded x-axis.

FIG. 11 graphically depicts the frequency response around the second harmonic, which is shown as having an overall bandwidth in the region around 304, for the frequency response curve 300 of the segmented spectrum clock generator. The individual single harmonics within a sideband that make up the individual segments of the frequency response are easily discerned on FIG. 11, and once again have equal bandwidths of about 240 kHz, which is the same bandwidth of the segments as was seen in the first harmonic graphical depiction of FIG. 10. The segments near the center of the second harmonic are indicated by the reference numerals 320, 322, and 324. As can be seen on FIG. 11, the segment 320 has the maximum amplitude of these three individual segments, and this amplitude peak is around 53 dBuV. The segment 322 has a much lower peak amplitude, whereas the segment 324 has an amplitude that nearly approaches the 53 dBuV point.

On the edges of the second harmonic frequency response are further individual segments, such as the segment at 326 that is lower in frequency than the center of the second harmonic, and further the segment at 328, which is greater in frequency than the center of the second harmonic. As discussed hereinabove, the minima at the "valleys" of these two segments 326 and 328 are not equal in amplitude, but these minima nevertheless define the beginning and end of the bandwidth of the individual single segments. As discussed hereinabove, the segmented spectrum clock generator's frequency response must exhibit a relatively sharp rolloff of at least 10 dB on either side of each peak of each individual segment. This 10 dB point will be measured at an offset frequency of +150 kHz from each individual peak of the segments.

Figure 12:
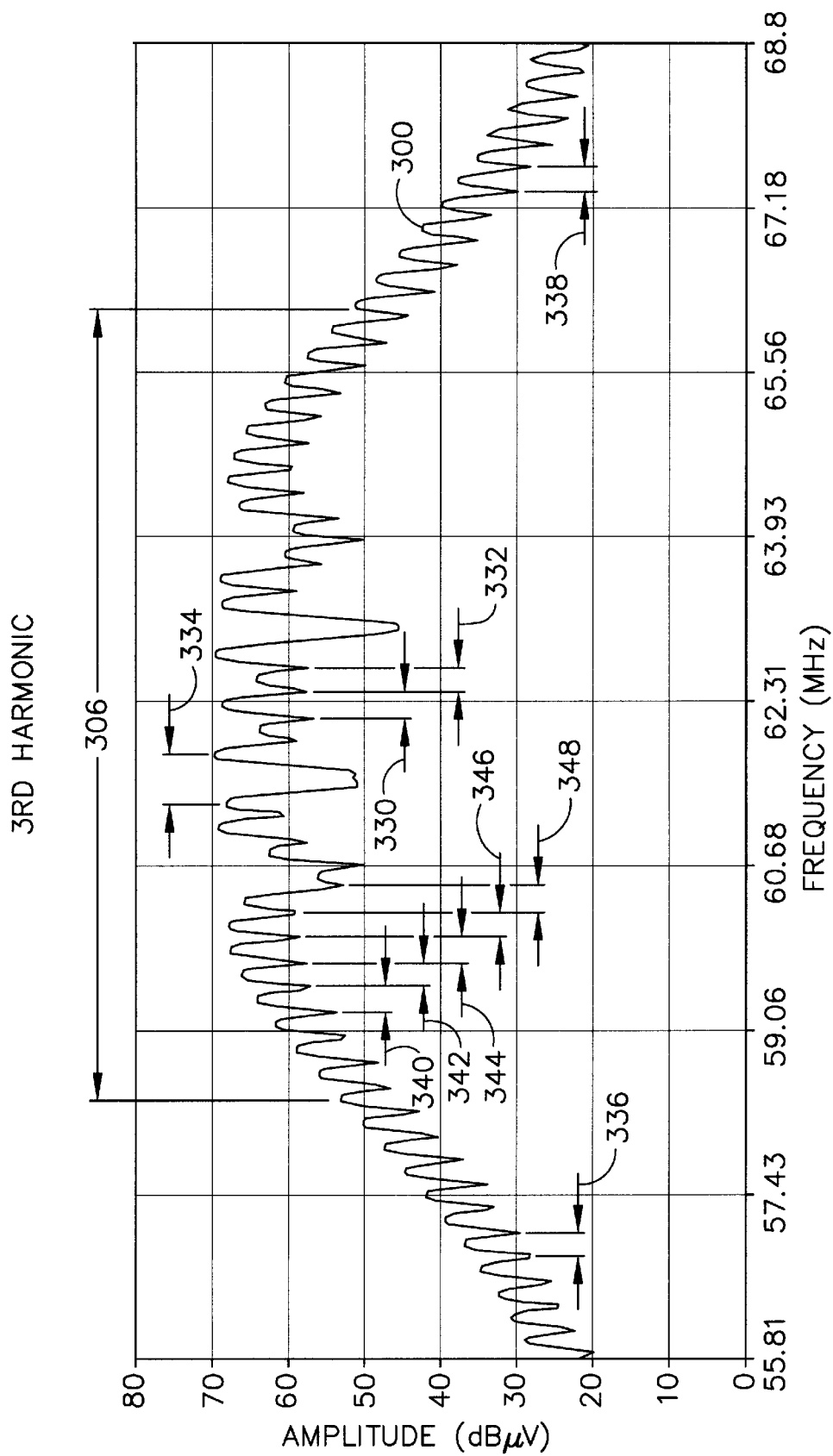
FIG. 12 is a graph showing the frequency spectrum produced by a preferred segmented spectrum clock generator, showing the third harmonic on an expanded x-axis.

FIG. 12 illustrates the frequency response curve 300 of the segmented spectrum clock generator at frequencies near the third harmonic, and the overall bandwidth of the third harmonic is shown on FIG. 12 designated by the reference numeral 306. As in the previous curves on FIGS. 10 and 11, the frequency response curve 300 is made up of multiple individual segments, and near the center of the third harmonic are segments designated at the reference numerals 330 and 332. Each of these segments is approximately 240 kHz in bandwidth, using the definition of segment bandwidth as described hereinabove.

Within the third harmonic overall bandwidth is a relatively long (in terms of bandwidth) valley between two peaks, as illustrated at the reference numeral 334. It so happens that this portion of the third harmonic has a segment that is more or less cancelled, and therefore, has a maximum point that is barely discernible on FIG. 12. In this situation, it is easy to see that the sharp rolloff between the two peaks that are indicated at 334 would easily meet the 10 dB rule at the + or −150 kHz offset frequency. This, however, is an anomaly and is not typical for the vast remainder of the frequency spectrum 300 of the segmented spectrum clock generator output.

The single segments that are indicated at the reference numerals 336 and 338 are fairly far removed from the center of the third harmonic and, as was seen in previous figures, their valleys are not at equal amplitudes. Nevertheless, their rolloffs are still relatively sharp, and their bandwidths are at 240 kHz, which is the same as the bandwidths of all of the other segments of the clock generator signal.

The portion of the third harmonic that would likely have the most problem meeting the proposed CISPR-22 rules would be the portion on one of the "shoulders" of the third harmonic. The "left" shoulder as viewed on FIG. 12 is made up of several individual segments, and collectively is designated by the reference numerals 340, 342, 344, 346, and 348. As can be seen in FIG. 12, each of these segments has a relatively sharp rolloff, has two valleys that immediately ramp up to their adjacent segments that have a relatively large peak amplitude, and has a relatively large peak amplitude that is within 10 dB of the maximum amplitude of any of the third harmonic segments. This portion of the third harmonic is analyzed in greater detail, as illustrated on FIG. 13.

Figure 13:
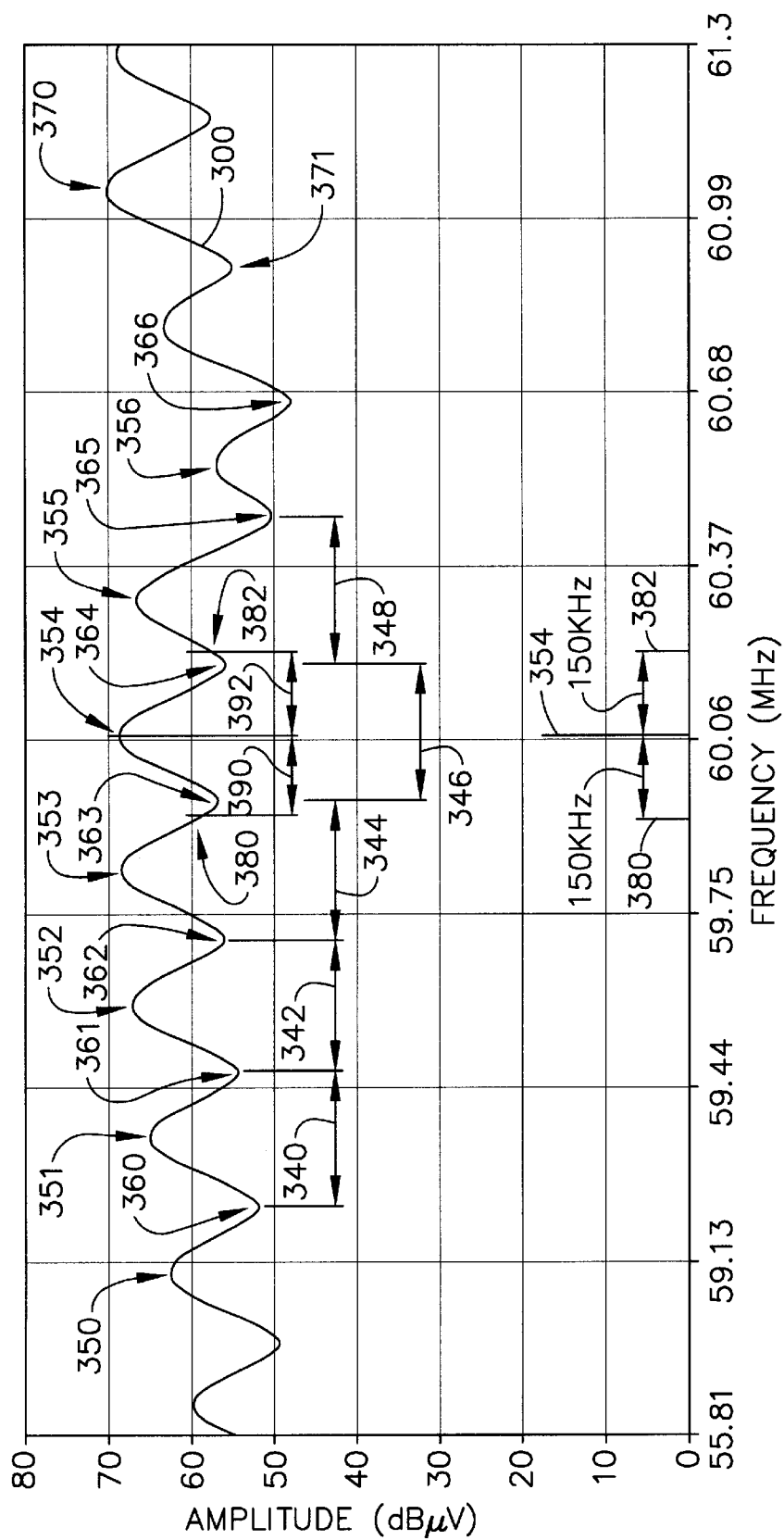
FIG. 13 is a graph showing the frequency spectrum produced by a preferred segmented spectrum clock generator, showing a magnified plot of a portion of the third harmonic.

FIG. 13 is an expanded plot along the x-axis (the frequency domain) of the left shoulder portion of the third harmonic that was depicted in FIG. 12. The individual segments 340, 342, 344, 346, and 348 are indicated for the frequency spectrum curve 300 of the segmented spectrum clock generator output. Each of these individual segments has a particular peak value and two particular valley minima values, and generally the valley minima values in amplitude are not necessarily equal. The peaks are indicated at the reference numerals 350–355, and their corresponding valleys are indicated at 360–364.

The largest peak (i.e., the one having the maximum amplitude) is indicated at 354, and has an amplitude of about 69 dBuV. The peak 353 of the segment to its left on FIG. 13 (i.e., segment 344) has an amplitude that is nearly as great, and further to the left (on FIG. 13) the segments 340 and 342 have relatively large peaks. To the right (on FIG. 13) of the peak 354 is another segment at 348 having a peak at 355. This peak is a few dB less than the 69 dBuV peak at 354, and furthermore the shape of the segment 344 is much different, since its right-hand valley at 365 is several dB lower than its left-hand valley indicated at 364.

The next peak to the right on FIG. 13 is indicated at the reference numeral 356, and its valley to its right (i.e., greater in frequency) is indicated at 366. The peak 356 is more than 10 dB in amplitude less than the maximum peak 354 of 69 dBuV.

The maximum peak illustrated on FIG. 13 is designated by the reference numeral 370, which is closer to the middle of the third harmonic (as can be seen in FIG. 12). The valley to its immediate left (on FIG. 13) is indicated at 371. As described hereinabove, the rolloff must be quite sharp for each of the individual segments to meet the proposed CISPR-22 rules. However, if the peak amplitude of an individual segment is less than 10 dB of the maximum amplitude of the particular harmonic being analyzed, then its rolloff (i.e., the rolloff for the much lower amplitude peak) does not have to be quite as sharp, because that individual peak will not be included in the emissions test. This is in reference specifically to the peak 356, which is much less in amplitude than the peak at 370, and is certainly more than 10 dB less than that peak at 370. Therefore, the offset frequency rolloff points at +150 kHz for the peak 356 will not apply to that particular segment.

The rolloff test is graphically indicated on FIG. 13 by the frequency offsets 390 and 392, that are bounded by vertical lines (on FIG. 13) 380, 354, and 382. The frequency deviation from the center of the individual segment (i.e., the offset frequency) is given by the proposed rules as being both +150 kHz and −150 kHz. The −150 kHz is indicated by the frequency spread or deviation 390, whereas the +150 kHz spread or deviation is indicated at 392. Therefore, the frequency marks 380 and 382 are the critical points where the frequency response must be at least 10 dB less than the peak at 354. Otherwise, the proposed CISPR-22 rule would not be met, and the frequency profile would be considered as a broadband frequency output, subject to newer and more stringent emissions rules.

As can be seen in FIG. 13, the amplitude of the frequency response curve 300 is almost exactly 10 dB less than the peak at 354 of the segment 346. (Note that this graphical illustration provides an example of a worst case design scenario when using a particular receiver, e.g., a Rhode and Schwartz Model ESI receiver, for the emissions test.) Therefore, this particular segmented spectrum clock generator frequency response would pass the proposed CISPR-22 rules, if they were to be implemented in Europe.

Since the proposed CISPR-22 rules use a frequency offset of +150 kHz, it might at first seem logical to use a modulation frequency of 150 kHz, so that the valleys between peaks of each of the segments would match up directly with the +150 kHz or −150 kHz offset frequency range. However, a certain aspect of the test procedures must be taken into consideration before determining what the best modulation frequency should be. If the receiver used in the emissions test was ideal to perfection, then the preferred modulation frequency would be exactly 150 kHz. However, no such perfect receiver exists, and in fact the CISPR rules allow for some receivers to be used in these emissions tests that really are not high in quality, at least with respect to what would be considered "ideal."

The pass-band limits of overall selectivity for such receivers is provided in the CISPR standard CISPR 16-1, and for Bands C and D, a chart is provided in FIG. 2c, on page 180 of the first edition of this CISPR 16-1 standard, dated 1993. An example of this chart is provided in FIG. 14, and is discussed hereinbelow. Since receivers that are used in these emissions tests are not all equal, the individual various types of receivers that measure the EMI emissions will not provide the same results when measuring the frequency spectrum of those emissions. This could have an unfortunate effect on the test results for an electronic device that is undergoing a test for such EMI emissions, and while this device under test may be perfectly designed and should pass the test given a particular type of model of receiver, it may not pass the test given a different type of model of receiver, even though both receivers are within the acceptable pass-band limits of selectivity. Accordingly, the modulation frequency of the segmented spectrum clock generator must be selected with care for a particular test setup.

One general rule is that, the lower a modulation frequency is for a clock signal, the easier it is to implement that clock, and the more useful the clock circuit used to generate that clock. Spread spectrum clock generator circuits tend to have modulation frequencies as low as 30 kHz. However, the segmented spectrum clock generator of the present invention requires a much greater modulation frequency, as noted before in the range of greater than 150 kHz, and including much higher modulation frequencies of well over 200 kHz.

LOWER BOUND FOR MODULATION FREQUENCY.

To better define the lower bound of modulation, the characteristics of the receivers that would be measuring the emissions from products must be considered. This includes products that utilize a segmented spectrum clock, as per the present invention, or products that utilize a spread spectrum clock. For various reasons, it is reasonable to design a product to pass on specific test equipment known to be within specifications.

As noted hereinabove, receiver characteristics are determined by CISPR 16-1 on page 180, FIG. 2c. This chart shows the bounds within which a receiver passband must lie in order to be within specification (see FIG. 14, at the curves 402 and 404). The farther from the receiver's tuned center frequency, the more attenuation that occurs. A narrow passband allows a much lower modulation frequency.

Figure 14:
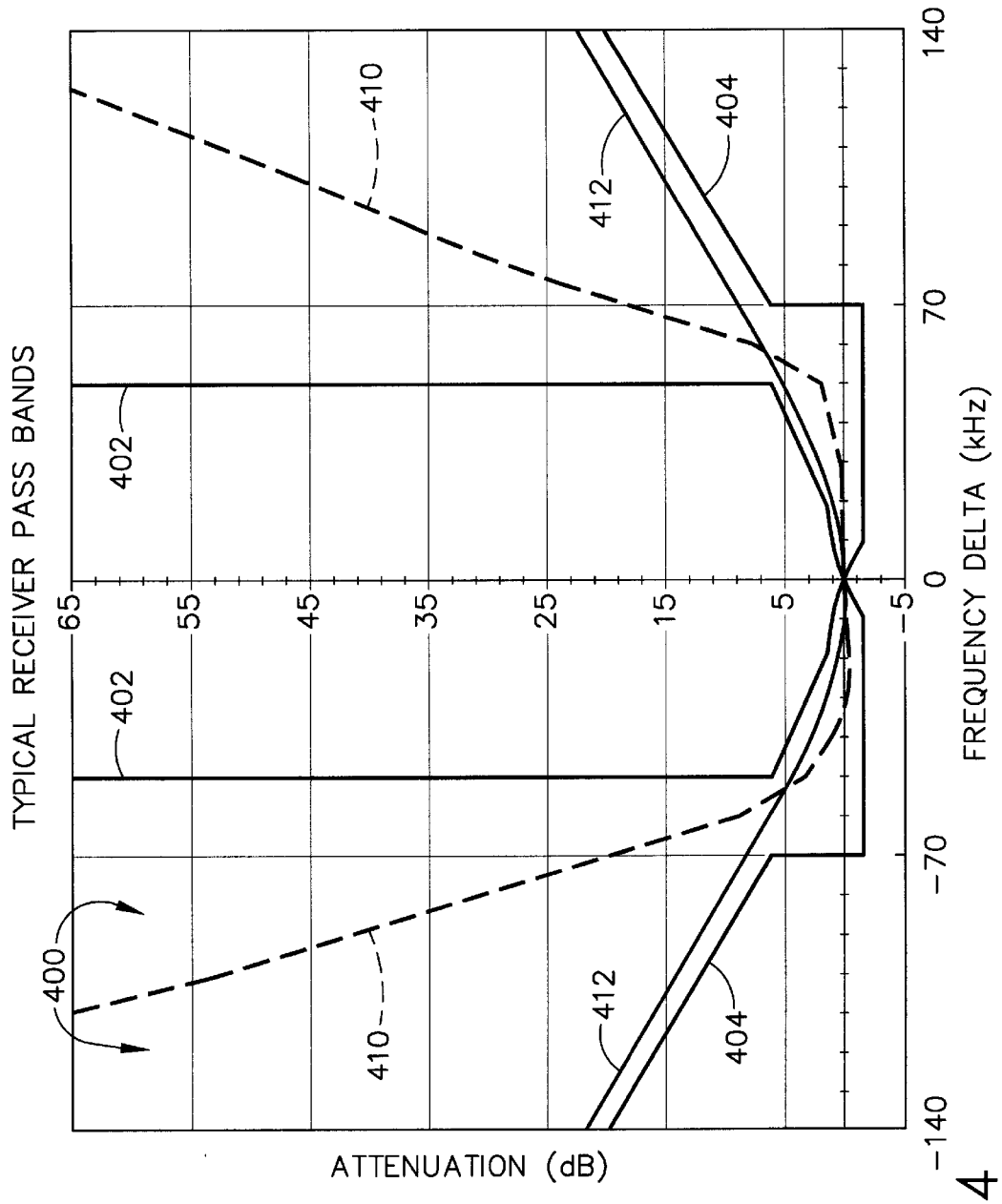
FIG. 14 is a graph showing typical receiver pass-bands as compared to the pass-band limits of overall selectivity as provided in the CISPR standard CISPR 16-1.

Based upon measurements of several different receivers, two of these receivers' passband characteristics were plotted on a similar chart, and the results are illustrated on FIG. 14. As noted hereinabove, on FIG. 14 the CISPR 16 lower boundary is plotted as the curve 402, the CISPR 16 upper boundary is plotted as the curve 404, which provides an area 400 between the two boundaries 402 and 404 within which a receiver is acceptable. All of the above receivers measured matched the two receivers plotted (at the curves 410 and 412) or fell between them. Of the tested receivers manufactured by Rhode and Schwartz, the Model ESVP had the narrower passband, and its characteristic curve is illustrated by the curve 410 on FIG. 14. The Rhode and Schwartz Model ESI passband was much wider, but still remains within specifications. Its characteristic curve is illustrated by the curve 412 on FIG. 14.

One may design his or her electronic equipment to pass an EMI emissions test to take place at a test site that uses any one of the receivers that fall within specifications. Once the test site (or test facility) has been certified, then the particular receiver used for the certification will likely be used in the future, since its test characteristics are not only known, but have also been approved (i.e., certified) for testing electronic equipment. Even if the particular receiver becomes defective, another similar receiver would likely be used as the replacement, probably of the same model number made by the same manufacturer.

The electronic equipment designer may choose to design the electronic equipment to pass the emissions test (including a CISPR test or an FCC test) at a testing facility that uses a wider passband receiver. For the purposes of the present invention, it is assumed that the wider passband receiver, such as the Rhode and Schwartz Model ESI, will be installed at the testing facility. This will affect the modulation frequency, including the considerations for determining the lower bound of the modulation frequency.

The present invention includes a methodology for determining the lower and upper bounds for the modulation frequency which takes into consideration the offset frequency and the testing facility equipment. At the testing facility, one of the primary considerations is the characteristics of the receiver. Understanding how the emissions receiver operates is important to designing the segmented spectrum clock of the present invention, and some of the operating principles and effects of the emissions receivers are now discussed, hereinbelow.

Figure 15:
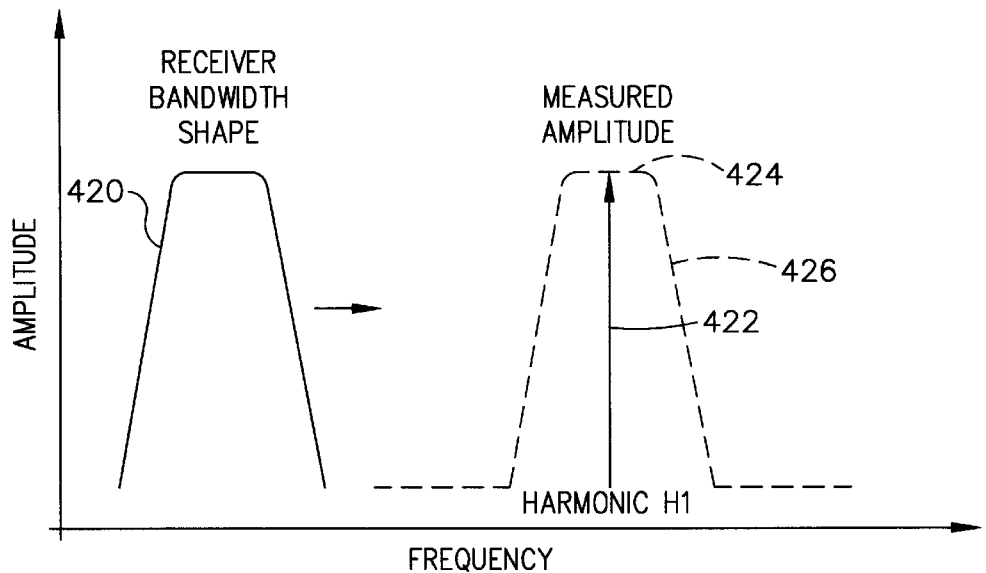
FIG. 15 is a frequency spectrum graph showing a receiver bandwidth shape as it samples a harmonic.

FIG. 15 shows how a receiver measures, for example, a single frequency spike. The shape of the receiver's passband is illustrated at the curve 420, on the left portion of FIG. 15. As the receiver sweeps its center frequency to the right, it multiplies its passband by the present frequency content and adds the individual pieces together. At the center of the receiver passband (see arrow 422 on FIG. 15), there is no attenuation, so that is the same as multiplying the amplitude by a '1' (see the measured amplitude curve 426 at its uppermost amplitude at 424). A single harmonic, H1, is represented by the arrow 422, and the dotted line (i.e., curve 426) around the arrow 422 shows what the receiver would actually measure. Notice that for a single harmonic, the resulting measured amplitude has the same shape (curve 426) as the receiver passband 420.

Figure 16:
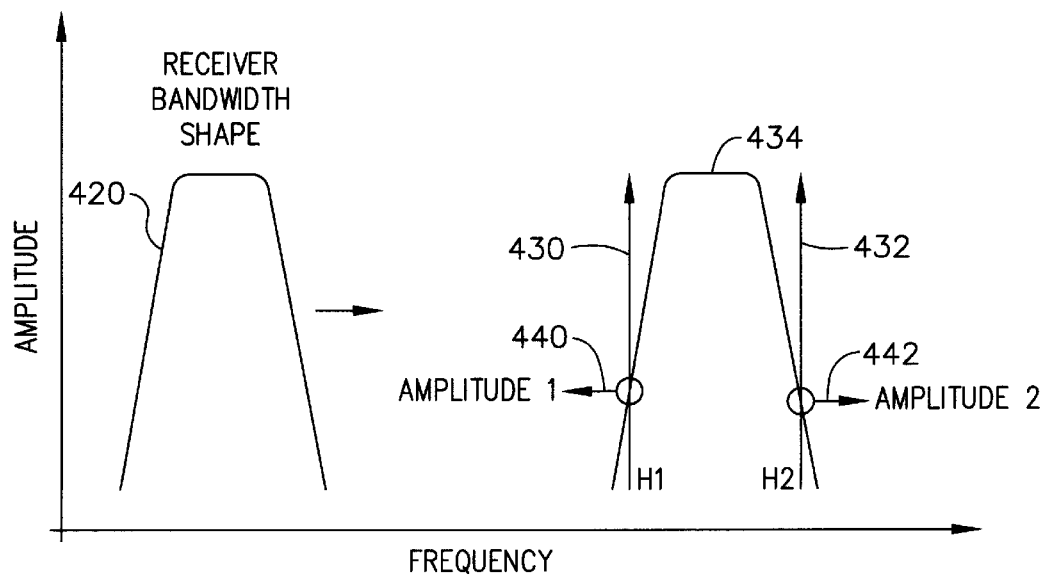
FIG. 16 is a frequency spectrum graph showing a receiver bandwidth shape as it simultaneously samples two harmonics.
Figure 17:
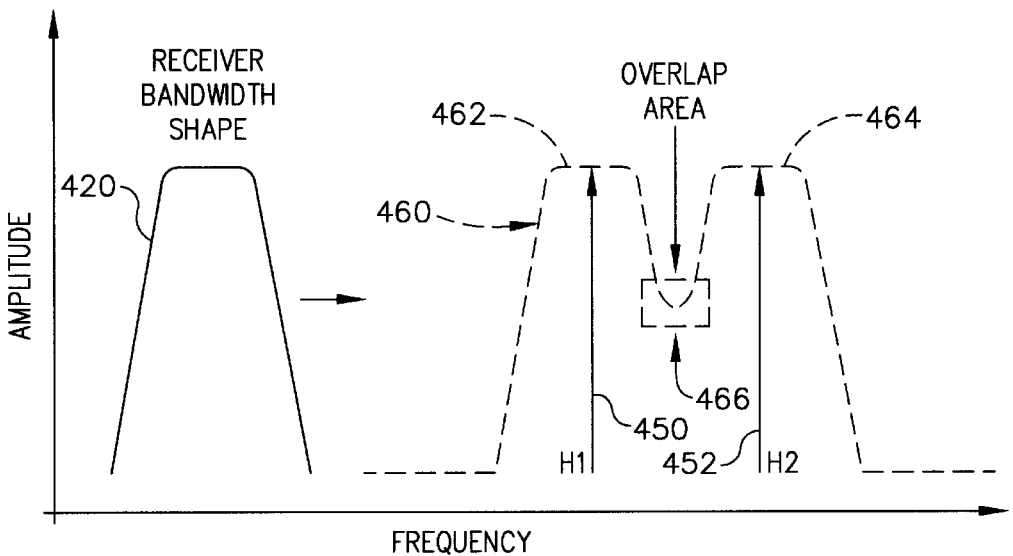
FIG. 17 is a frequency spectrum graph showing a receiver bandwidth shape as it simultaneously samples two harmonics, in which the harmonics are somewhat separated while having an overlap area.

FIGS. 16 and 17 show what happens when two harmonics exist close enough that the receiver passband encompasses both of them. In FIG. 16, the passband shape 420 is superimposed over the two harmonics, H1 (at 430) and H2 (at 432), and the superimposed passband curve is designed by the reference numeral 434. Both harmonics 430 and 432 are measured on the skirts of the passband for this specific instant, and are highly attenuated (as seen at the amplitude values at 440 and 442, respectively) before being added together.

FIG. 17 shows the same two harmonics, now designated by the reference numerals 450 and 452. The dotted curve 460 shows the amplitude measured and reported by the receiver. Notice that the shape is the same as the receiver passband centered at each harmonic with one exception: directly between the two harmonics 450 and 452 is an overlap area, designated by the reference numeral 466. This overlap area 466 is where both harmonics 450 and 452 are present within the receiver passband (as in FIG. 16) and add together. Note that the maximum amplitude of the dotted curve 460 occurs at 462 proximal to the harmonic at 450, and again occurs at 464 proximal to the harmonic at 452. Of course, of the two harmonics H1 and H2 at 450 and 452 were of different amplitudes, then the maximum amplitude proximal to these harmonics (i.e., the dotted curve at the regions 462 and 464) would not have substantially equal amplitudes on the frequency response curve of FIG. 17.

Figure 18:
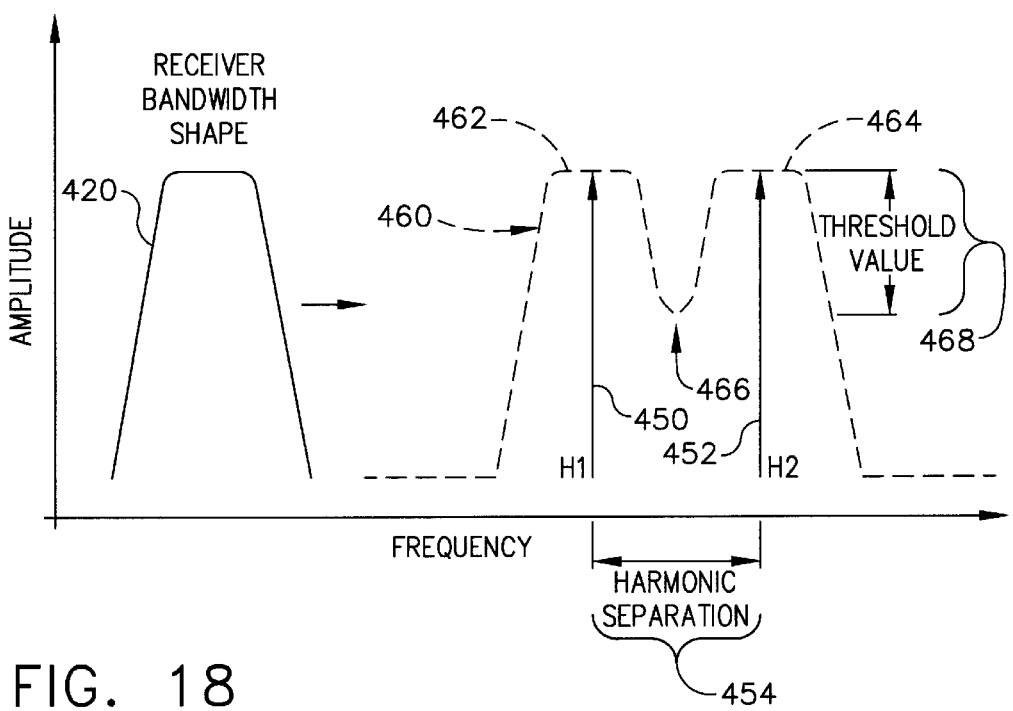
FIG. 18 is a frequency spectrum graph showing a receiver bandwidth shape as it simultaneously samples two harmonics, in which the harmonic separation is sufficiently large to observe a rolloff greater than a threshold value.

FIG. 18 illustrates the minimum frequency separation between adjacent harmonics for a given threshold value. The dotted curve at 460 again shows the amplitude measured and reported by the receiver. The maximum amplitude frequency response output by the receiver is indicated at 462 and 464 proximal to the harmonics H1 and H2 at 450 and 452, and an overlap area is again indicated at 466.

If it were desired that there be a valley between the two harmonics H1 and H2 that was a specific measured amplitude below the peaks of the harmonics, it would be necessary to have a minimum harmonic separation. This could correspond to a minimum modulation frequency. This point could occur when both harmonics exist within the receiver passband.

On FIG. 18, the harmonic separation between harmonics H1 and H2 is indicated at the reference numeral 454. The value (in units of frequency) for this separation 454 is determined by the methodology of the present invention, as discussed hereinbelow. A threshold value is indicated at the reference numeral 468, which is a rolloff value of interest in the design of the electronic equipment under test that uses the segmented spectrum clock generator of the present invention. As will be seen in FIG. 19 and discussed hereinbelow, the threshold value is one of the criteria in determining the harmonic separation 454.

Figure 19:
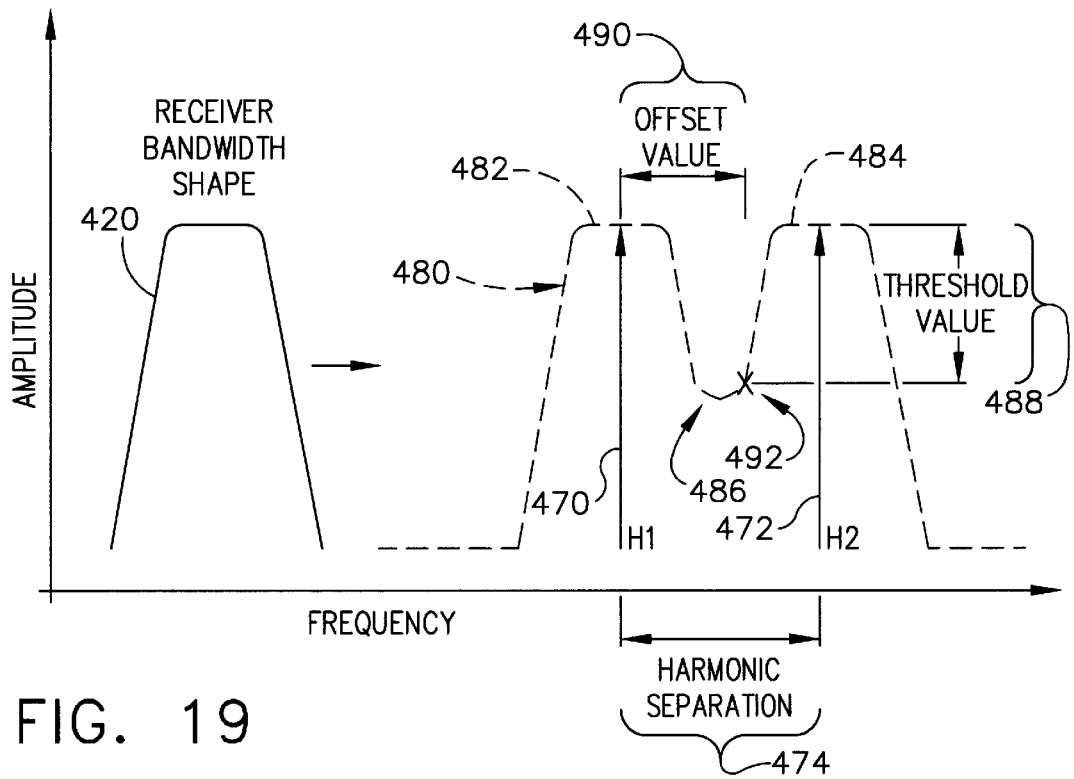
FIG. 19 is a frequency spectrum graph showing a receiver bandwidth shape as it simultaneously samples two harmonics, in which the harmonic separation is sufficiently large to observe a rolloff greater than a threshold value at a predetermined offset frequency.

FIG. 19 illustrates the harmonic separation (at 474 on this figure) necessary for a given specified offset value and a given desired threshold value. Similar to FIG. 18, a dotted curve at 480 shows the amplitude measured and reported by the receiver, the maximum amplitude frequency response output by the receiver is indicated at 482 and 484 proximal to two harmonics H1 and H2 at 470 and 472, and an overlap area is indicated at 486. On FIG. 19 the threshold value is indicated at 488, and the harmonic separation is indicated at 474.

The offset value is a frequency offset where the amplitude shall be measured from the peak measured value. For example, if it is determined that it is necessary for the frequency spectrum to have a characteristic (to prevent interference) such that at 120 kHz to either side of a peak the measured amplitude is 6 dB down from the peak, the necessary harmonic separation can be determined from a similar equation to the one provided hereinbelow. This harmonic separation can be considered the lower bound of the modulation frequency of the segmented spectrum clock generator of the present invention. In the above example, 120 kHz would be the offset value, indicated at the reference numeral 490, and 6 dB would be the threshold value 488. The point indicated at the reference numeral 492 represents the intersection of the offset value 490, the threshold value 488, and the dotted curve 480.

Figure 20:
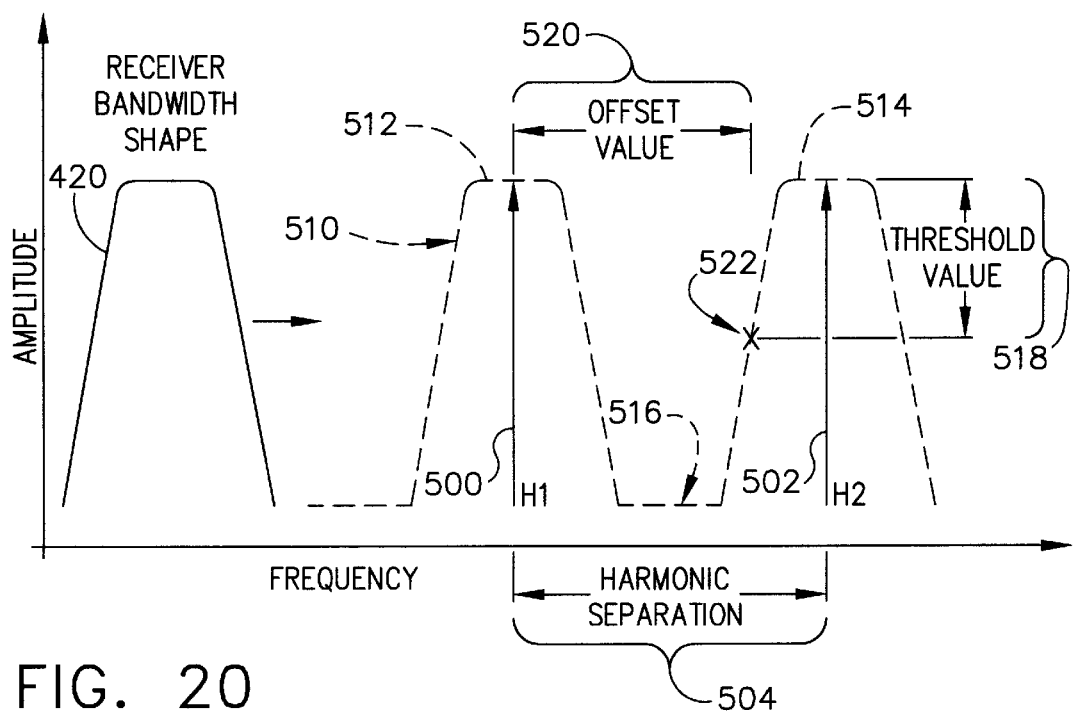
FIG. 20 is a frequency spectrum graph showing a receiver bandwidth shape as it simultaneously samples two harmonics, in which the harmonic separation is much larger and observes a rolloff greater than a threshold value at a predetermined offset frequency.

FIG. 20 illustrates a situation similar to that of FIG. 19. A dotted curve at 510 shows the amplitude measured and reported by the receiver, the maximum amplitude frequency response output by the receiver is indicated at 512 and 514 proximal to two harmonics H1 and H2 at 500 and 502, the threshold value is indicated at 518, and the harmonic separation is indicated at 504. The offset value is indicated at 520, and the point on the curve 510 that is specified by the intersection of the offset value 520 and threshold value 518 is indicated at the reference numeral 522.

The main difference between FIGS. 19 and 20 is that the harmonic separation between the harmonics H1 and H2 is sufficiently large that the offset value 520 will no longer fall within the receiver passband at the same time. Therefore, there is no "overlap area," such as was found at 486 on FIG. 19. For a given threshold value and offset value, an equation can give the necessary harmonic separation for this situation, which is typically greater than that specified by the lower bound of the modulation frequency. Since there is no overlap area, the frequency response curve 510 falls to a minimum value at 516 that is between the maximum rolloff slopes of the receiver passband shapes surrounding the harmonics H1 and H2 at 500 and 502.

As noted hereinabove, the lower limit for modulation frequency (i.e., the "lower bound") is dependent on the receiver used to test the equipment within which the segmented spectrum clock generation circuit functions. The passband characteristics of the receiver must fall within specifications defined by CISPR 16-1, page 180, FIG. 2c. Due to variances in receiver design, the passband characteristics of the measuring receiver may fall anywhere within these bounds, and two typical receivers are shown in FIG. 14. The passbands of these two receivers was determined by measuring a pure clock harmonic at 100.0138 MHz (CISPR Quasi-Peak method).

The defining characteristic of the lower limit or lower bound is that the measured amplitude, offset a certain frequency from a peak (e.g., 150 kHz), is at least a certain threshold value (e.g., 10 dB) below the peak amplitude. As an initial step in this methodology, it is assumed that the measured peak value is due to a single, pure clock harmonic of amplitude 0 dB.

A second clock harmonic is now introduced, and the amplitude at exactly between the two clock frequencies is measured (assuming both frequencies are within the receiver passband). Assume if only one harmonic was present that the measured amplitude would be −10 dB. However, since there are two harmonics, the measured amplitude would be equal to:

$$-10 \text{ dB} + 6 \text{ dB} = -4 \text{ dB}.$$

The final step is to calculate the necessary separation between harmonics, and therefore, the required lower bound of the modulation frequency. This means that the absolute minimum modulation frequency possible, without an offset value constraint, is the point when two harmonics together are attenuated by 16 dB (receiver tuned to point between both harmonics). This gives a measured amplitude of 10 dB down from the maximum amplitude directly between the two harmonics.

The passband of a receiver, Rhode and Schwartz Model ESI, has been experimentally determined, and polynomial equations have been derived from a curve-fitting process. From these equations, the minimum separation for the receiver can be determined. The R/S ESI receiver represents what can be considered typical of the worst-case for allowable receivers that meet the CISPR specifications.

If the segmented spectrum clock generation circuit is designed for this case, then the following Equation #1 provided below is used to determine what the minimum modulation frequency is for any given offset value. Equation #1 is valid for all modulation frequencies above an absolute minimum modulation frequency, as noted below. This Equation #1 returns a value for the minimum modulation frequency given an offset value, and for a required maximum measured amplitude of 10 dB below the relevant peak amplitude.

$$f(x) = (600.904) \exp(-0.028x) + x + 80.122 \qquad \text{EQUATION \#1}$$

The variable x is the offset value in kHz. Equation #1 is based upon a threshold value of 10 dB. The absolute minimum modulation frequency is 109.9 kHz for Equation #1 to provide valid numeric results, which means that the harmonic separation will be at least twice that value (i.e., at least 219.8 kHz). The result f(x) is the minimum modulation frequency in kHz.

As an example, assume that the required offset value is 150 kHz. Equation #1 provides the following result:

$$f(150) = (600.904) \exp(-0.028 * 150) + 150 + 80.122 = 239.13 \text{ kHz}.$$

Based upon the above given values and threshold assumptions, the results of Equation #1 has been verified experimentally. As noted hereinabove, Equation #1 was derived from experimental data. The derivation involved polynomial best fit curves as well as exponential best fit curves.

Some general statements can be made with respect to determining the lower bound of the modulation frequency of the segmented spectrum clock generator as used in the present invention: assuming that the peak amplitude of the EMI emissions is at the emissions limit, then the separation of the harmonics needs to be such that the received amplitude drops by 10 dB before measuring the next segment. In general, the minimum frequency spacing is where the receiver band-pass has two harmonics that are of equal amplitude, and each being 16 dB below the peak. For a typical receiver that is in the middle of the CISPR allowable pass-band, the separation frequency is greater than 160 kHz. If the receiver is at the worst case allowable under the CISPR-22 pass-band, then the separation frequency is greater than 228 kHz. These frequency values are the lower bounds for the modulation frequencies of the segmented spectrum clock generation circuit, such as the circuit 100 illustrated on FIG. 3.

UPPER BOUND FOR MODULATION FREQUENCY.

There is a range of modulation frequencies that provide attenuation benefits for a spread spectrum clock, or for a segmented spectrum clock. In the case of a segmented spectrum clock as per the present invention, the maximum useful modulation frequency is a function of clock frequency, frequency deviation, and the clock harmonic where attenuation is necessary. In general, the maximum useful modulation frequency is directly proportional to these factors. All harmonics above the harmonic of interest will receive equal or greater attenuation than the actual harmonic of interest.

A further factor in selecting a modulation frequency is the shape of the modulation profile, such as the modulation profile illustrated in FIG. 4, and described hereinabove. The maximum useful modulation frequency, or the "upper bound" for this modulation frequency, can be defined by an equation, which is presented below as Equation #2. The formula of this Equation #2 is the same general format for all modulation profiles, although different constants would apply for different types of modulation profiles. In the present invention, the maximum modulation frequency is less than or equal to the following quantity:

$$MaxModFreq=(a+(b*D*N*F))*D*N*F \quad \text{EQUATION \#2}$$

In the above formula, "a" and "b" are constants depending upon the modulation profile shape. "D" is the percentage deviation divided by 100; "N" is the clock harmonic of interest; and "F" is the fundamental clock frequency.

An example is now provided using the above formula to determine the maximum modulation frequency. Assuming a clock frequency of 33 MHz and a deviation of +0.5%, assume that because of product construction, the emissions of the third harmonic of 33 MHz are too high. If the "best case" modulation profile is assumed, then the expected values for "a" and "b" are: a=0.24, and b=−2.762×10$^{-9}$. In this example, the variables used in Equation #2 are as follows: a=0.24, b=−2.762×10$^{-9}$, D=2*0.5/100=0.01, N=3, and F=33×10$^6$. After making the calculations using the above factors, it turns out that the maximum modulation frequency should be less than or equal to 234.89×10$^3$ Hz. The maximum modulation frequency (MMF) in this case, therefore, is 234.89 kHz.

Table #1 lists below the maximum modulation frequency for several common clock frequencies and deviations, assuming a best case modulation profile (i.e., the "ideal Lexmark profile" illustrated in FIG. 4).

TABLE 1

Maximum Modulation Frequencies for Given Clock Frequencies and Deviations
(Best Modulation Profile)

| Clock Fundamental Frequency (MHz) | Maximum Modulation Frequency (kHz) for Respective Deviation at 3rd Harmonic | | |
|---|---|---|---|
| | ±0.5% Deviation | ±1.875% Deviation | ±5.0% Deviation |
| 33 | 234.89 | 852.93 | 2105.30 |
| 66 | 464.37 | 1629.73 | 3669.19 |
| 100 | 695.14 | 2350.43 | 4714.20 |
| 133 | 913.63 | 2972.65 | 5178.87 |
| 167 | 1133.07 | 3534.10 | 5091.35 |
| 200 | 1340.57 | 4001.74 | 4456.80 |

For a triangular modulation profile, the expected values for "a" and "b" are: a=0.274 and b=−2.888×10−9. For a sinusoidal modulation profile, the expected values for "a" and "b" are: a=0.334 and b=−3.232×10$^{-9}$, and for a modulation profile that is exponential (having a "shark fin" shape), the expected values for "a" and "b" are: a=0.406 and b=−5.721×10$^{-9}$. The staircase triangular profile described hereinabove with respect to FIG. 6 will mainly have values that approximate the triangular profile illustrated on FIG. 5. Other embodiments of the staircase triangular profile might include as few as one step per side. It is not implied that FIG. 6 limits in any way the number of steps possible.

Another way of producing a segmented spectrum profile could be to vary over time the modulation frequency, thereby providing a modulated modulation frequency for the segmented spectrum clock generator circuit. Any of the above modulation profiles could be modulated in this way. This is not necessarily the best mode for producing a low noise segmented spectrum clock generation output that would meet the proposed CISPR-22 standards, but it may have other advantages useful to meet other standards.

It will be understood that the segmented spectrum clock generator of the present invention could be used to generate any range of frequencies at its output 154 without departing from the principles of the present invention. It may be more efficient to create a certain frequency range for the segmented spectrum profile by use of an external crystal/oscillator circuit that generates a particular frequency, however, the most important aspect in choosing components is to use an external clock that has a very stable frequency output, in which the circuit designer can depend upon the stability of that clock.

It will further be understood that the principles of the present invention will work with any type of modulated waveform for the segmented spectrum profile, not only including a sinusoidal profile, but including a very smooth profile, or a jagged or "peaky" profile, which of course, is the preferred embodiment of the present invention. Moreover, the modulation frequency itself can be set anywhere within a range of frequency between a lower bound and an upper bound for a given test setup used for testing the EMI emissions of the device incorporating the segmented spectrum clock of the present invention; the modulation frequency itself can even be modulated over time, if desired.

It will be yet further understood that a segmented spectrum clock generation circuit may be designed and constructed to provide a frequency spectrum having threshold rolloffs other than 10 dB or 16 dB at offset frequencies other than +150 kHz, without departing from the principles of the present invention. Virtually any threshold value or offset frequency could be designed into the segmented spectrum clock generation circuit, and each set of values could be used as factors in determining a lower bound and an upper bound for modulation frequencies of the spectrum profile.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A method for controlling a segmented spectrum clock generator, said method comprising:

providing a clock signal to a frequency synthesizer circuit, and providing a controller; said frequency synthesizer under control of said controller generating a plurality of output frequencies over time; and modulating said plurality of output frequencies over at least one time interval according to a modulation profile, such that a frequency response of said plurality of output frequencies exhibits a segmented waveform over a spectrum of amplitude vs. frequency, in that said segmented waveform comprises a plurality of individual segments that each exhibit: (a) a maximum amplitude and (b) a pair of minima amplitudes, wherein said frequency response between said maximum amplitude and each of the pair of minima amplitudes exhibits on a CISPR-22 receiver at least a 10 dB rolloff at a predetermined frequency difference from a center frequency of said individual segment.

2. The method as recited in claim 1, wherein said modulation profile exhibits a shape on a chart that plots output frequency over a time interval, and said modulation profile shape comprises one of: (a) a substantially peaky shape in which a curve between minimum and maximum peaks varies in slope with a predetermined inflection; (b) a triangular shape in which a curve between minimum and maximum peaks maintains a substantially constant slope; (c) a staircase triangular shape in which a curve between minimum and maximum peaks maintains an overall substantially constant slope, but at predetermined shorter time intervals alternates between a substantially steep slope and a substantially horizontal line segment; (d) a sinusoidal shape in which, between minimum and maximum peaks, a curve is substantially smooth and varies according to the derivative of a sine curve; or (e) an exponential shape in which a curve between minimum and maximum peaks varies in slope by at least one exponential time constant.

3. The method as recited in claim 1, wherein said rolloff is sufficiently sharp that a minimum amplitude of the segmented waveform is less than said maximum amplitude of the plurality of individual segments of interest by a magnitude of more than 10 dB at said predetermined frequency difference from the center frequency of said individual segment.

4. The method as recited in claim 3, wherein said predetermined frequency difference from the center frequency of said individual segment comprises +150 kHz and −150 kHz from said center frequency.

5. The method as recited in claim 1, wherein said rolloff is sufficiently sharp that a minimum amplitude of the segmented waveform is less than said maximum amplitude of the plurality of individual segments of interest by a magnitude of 16 dB or more, at said predetermined frequency difference from the center frequency of said individual segment.

6. The method as recited in claim 5, wherein said predetermined frequency difference from the center frequency of said individual segment comprises +150 kHz and −150 kHz from said center frequency.

7. The method as recited in claim 1, wherein said modulation profile operates at a modulation frequency having a lower bound within a range of 150 kHz to 240 kHz, inclusive.

8. The method as recited in claim 7, wherein said modulation frequency is substantially constant.

9. The method as recited in claim 7, wherein said modulation frequency varies over time.

10. The method as recited in claim 1, wherein said modulation profile operates at a modulation frequency having an upper bound within a range of 234 kHz to 1340 kHz, inclusive.

11. A method for controlling a segmented spectrum clock generator at a modulation frequency above a lower bound modulation frequency, said method comprising:

providing a clock signal to a frequency synthesizer circuit, and providing a controller; said frequency synthesizer under control of said controller generating a plurality of output frequencies over time; and modulating said plurality of output frequencies over at least one time interval according to a modulation profile, such that a frequency response of said plurality of output frequencies exhibits a segmented waveform over a spectrum of amplitude vs. frequency, in that said segmented waveform comprises a plurality of individual segments that each exhibit: (a) a maximum amplitude and (b) a pair of minima amplitudes, wherein said plurality of output frequencies is modulated at a rate greater than the lower bound modulation frequency that is dependent upon: a predetermined offset value, threshold value, and harmonic separation, and which takes into account pass-band limit of overall selectivity of a receiver used to test said segmented spectrum clock generator.

12. The method as recited in claim 11, wherein said modulation profile exhibits a shape on a chart that plots output frequency over a time interval, and said modulation profile shape comprises one of: (a) a substantially peaky shape in which a curve between minimum and maximum peaks varies in slope with a predetermined inflection; (b) a triangular shape in which a curve between minimum and maximum peaks maintains a substantially constant slope; (c) a staircase triangular shape in which a curve between minimum and maximum peaks maintains an overall substantially constant slope, but at predetermined shorter time intervals alternates between a substantially steep slope and a substantially horizontal line segment; (d) a sinusoidal shape in which, between minimum and maximum peaks, a curve is substantially smooth and varies according to the derivative of a sine curve; or (e) an exponential shape in which a curve between minimum and maximum peaks varies in slope by at least one exponential time constant.

13. The method as recited in claim 11, wherein a substantial rolloff between said maximum amplitude and said minima amplitudes is sufficiently sharp that a minimum amplitude of the segmented waveform is less than said maximum amplitude of the plurality of individual segments of interest by a magnitude of more than of 10 dB at said predetermined offset frequency from the center frequency of said individual segment.

14. The method as recited in claim 13, wherein said predetermined offset frequency from the center frequency of said individual segment comprises +150 kHz and −150 kHz from said center frequency.

15. The method as recited in claim 13, wherein said lower bound modulation frequency is substantially equal to:

$$f(x)=(600.904)exp(-0.028x)+x+80.122$$

where, "x" is a predetermined offset value in kHz, a threshold value is 10 dB, and "f(x)" is the lower bound modulation frequency in kHz.

16. The method as recited in claim 11, wherein said modulation profile operates at a modulation frequency having said lower bound within a range of 150 kHz to 240 kHz, inclusive.

17. A method for controlling a segmented spectrum clock generator at a modulation frequency below an upper bound modulation frequency, said method comprising:

providing a clock signal to a frequency synthesizer circuit and providing a controller; said frequency synthesizer under control of said controller generating a plurality of output frequencies over time; and modulating said plurality of output frequencies over at least one time interval according to a modulation profile, such that a frequency response of said plurality of output frequencies exhibits a segmented waveform over a spectrum of amplitude vs. frequency, in that said segmented waveform comprises a plurality of individual segments that each exhibit (a) a maximum amplitude and (b) a pair of minima amplitudes, wherein said plurality of output frequencies is modulated at a rate less than the upper bound modulation frequency that is dependent upon: clock frequency, frequency deviation, and a predetermined clock harmonic where attenuation is desired.

18. The method as recited in claim 17, wherein attenuation at harmonics greater than said predetermined clock harmonic is greater than attenuation at said predetermined clock harmonic.

19. The method as recited in claim 17, wherein said upper bound modulation frequency is filter dependent upon: a shape of a modulation profile.

20. The method as recited in claim 19, wherein said modulation profile operates at a modulation frequency having an upper bound within a range of 234 kHz to 1340 kHz, inclusive.

21. The method as recited in claim 19, wherein said upper bound modulation frequency is substantially equal to:

$$MaxModFreq=(a+(b*D*N*F))*D*N*F.$$

where, "a" and "b" are constants depending upon said modulation profile shape, "D" is the percentage frequency deviation divided by 100, "N" is the clock harmonic of interest, "F" is a fundamental clock frequency, and "MaxModFreq" is said upper bound modulation frequency in kHz.

22. The method as recited in claim 21, wherein said modulation profile exhibits a shape on a chart that plots output frequency over a time interval, and said modulation profile shape comprises one of:

(a) a substantially peaky shape in which a curve between minimum and maximum peaks varies in slope with a predetermined inflection, where "a"=0.24, and "b"=−2.762×10$^{-9}$;

(b) a triangular shape in which a curve between minimum and maximum peaks maintains a substantially constant slope, where "a"=0.274 and "b"=−2.888×10$^{-9}$;

(c) a staircase triangular shape in which a curve between minimum and maximum peaks maintains an overall substantially constant slope, but at predetermined time intervals alternates between a substantially steep slope and a substantially horizontal line segment, and where "a" and "b" are values that approximate said triangular profile;

(d) a sinusoidal shape in which a curve between minimum and maximum peaks is substantially smooth and varies according to the derivative of a sine curve, where "a"=0.334 and "b"=−3.232×10$^{-9}$; or (e) an exponential or sawtooth shape in which a curve between minimum and maximum peaks varies in slope by an exponential time constant, where "a"=0.406 and "b"=−5.721×10$^{-9}$.

23. A segmented spectrum clock generator, comprising: a controller and a frequency synthesizer circuit having a clock signal input, said frequency synthesizer under control of said controller generating a plurality of output frequencies over time according to a modulation profile, such that a frequency response of said plurality of output frequencies exhibits a segmented waveform over a spectrum of amplitude vs. frequency, in that said segmented waveform comprises a plurality of individual segments that each exhibit: (a) a maximum amplitude and (b) a pair of minima amplitudes, wherein said frequency response between said maximum amplitude and each of the pair of minima amplitudes exhibits a 10 dB rolloff at a predetermined frequency difference from a center frequency of said individual segment.

24. The segmented spectrum clock generator as recited in claim 23, wherein said modulation profile exhibits a shape on a chart that plots output frequency over a time interval, and said modulation profile shape comprises one of: (a) a substantially peaky shape in which a curve between minimum and maximum peaks varies in slope with a predetermined inflection; (b) a triangular shape in which a curve between minimum and maximum peaks maintains a substantially constant slope; (c) a staircase triangular shape in which a curve between minimum and maximum peaks maintains an overall substantially constant slope, but at predetermined shorter time intervals alternates between a substantially steep slope and a substantially horizontal line segment; (d) a sinusoidal shape in which, between minimum and maximum peaks, a curve is substantially smooth and varies according to the derivative of a sine curve; or (e) an exponential shape in which a curve between minimum and maximum peaks varies in slope by at least one exponential time constant.

25. The segmented spectrum clock generator as recited in claim 23, wherein said rolloff is sufficiently sharp that a minimum amplitude of the segmented waveform is less than said maximum amplitude of the plurality of individual segments of interest by a magnitude of more than 10 dB at said predetermined frequency difference from the center frequency of said individual segment.

26. The segmented spectrum clock generator as recited in claim 25, wherein said predetermined frequency difference from the center frequency of said individual segment comprises +150 kHz and −150 kHz from said center frequency.

27. The segmented spectrum clock generator as recited in claim 23, wherein a modulation frequency is substantially constant.

28. The segmented spectrum clock generator as recited in claim 23, wherein a modulation frequency varies over time.

29. The segmented spectrum clock generator as recited in claim 23, wherein said frequency synthesizer comprises one of a phase locked loop, a digital locked loop, or a delay locked loop.

30. The segmented spectrum clock generator as recited in claim 29, wherein said frequency synthesizer includes programmable registers, including a feedback register and an address register, that determine said modulation profile and modulation frequency of said plurality of output frequencies.

31. The segmented spectrum clock generator as recited in claim 23, wherein said controller comprises one of: sequential logic, a logic state machine, or a microprocessor using instructions of a computer program.

32. The segmented spectrum clock generator as recited in claim 31, wherein said controller and said frequency synthesizer use a memory circuit to store variable data, and said memory circuit comprises one of: Random Access Memory, Read Only Memory, a plurality of logic gates, or a plurality of programmable registers.

* * * * *